United States Patent [19]
Takahashi et al.

[11] Patent Number: 6,118,170
[45] Date of Patent: Sep. 12, 2000

[54] RESISTANCE ELEMENT HAVING FLEXING PORTION AND ITS MANUFACTURING METHOD

[75] Inventors: Toshifumi Takahashi; Keita Kumamoto, both of Tokyo, Japan

[73] Assignee: NEC Corporation, Tokyo, Japan

[21] Appl. No.: 09/228,752

[22] Filed: Jan. 12, 1999

[30] Foreign Application Priority Data

Jan. 13, 1998 [JP] Japan .................................. 10-004809

[51] Int. Cl.[7] .................................................. H01L 29/00
[52] U.S. Cl. ........................................... 257/536; 257/538
[58] Field of Search ................................... 257/536, 537, 257/538

[56] References Cited

U.S. PATENT DOCUMENTS 4,236,832  12/1980  Komatsu et al. .
4,245,209  1/1981  Bertotti et al. .

FOREIGN PATENT DOCUMENTS

| | | |
|---|---|---|
| 54-140488 | 10/1979 | Japan . |
| 58-30151 | 2/1983 | Japan . |
| 59-172761 | 9/1984 | Japan . |
| 62-199046 | 9/1987 | Japan . |
| 1-260849 | 10/1989 | Japan . |
| 9-219494 | 8/1997 | Japan . |

Primary Examiner—Shelia V. Clark

[57] ABSTRACT

In a resistance element formed by a connection layer including a flexing portion, the connection layer is constructed by a high resistance section including the flexing portion and a low resistance section. Boundaries between the high resistance section and the low resistance section are approximately in parallel with a bisector of the connection layer at the flexing portion.

8 Claims, 30 Drawing Sheets

RESISTANCE ELEMENT HAVING FLEXING PORTION AND ITS MANUFACTURING METHOD

BACKGROUND OF THE INVENTION

1. Field of the Invention

The present invention relates to a resistance element which is used as a load resistor in a resistance type static random access memory (SRAM) device or the like.

2. Description of the Related Art

A prior art resistance element is formed by a connection layer having a flexing point divided into a high resistance section and a low resistance section. In this case, the high resistance section includes the flexing point. The flexing point is a bending point or turning point of the connection layer and is identified as point 1a. A boundary between the high resistance section and the low resistance section is perpendicular to the connection layer, and another boundary 100c between the high resistance section and the low resistance section is also perpendicular to the connection layer. The resistance value R of the connection layer is substantially determined by the high resistance section. This will be explained later in detail.

In the prior art resistance element, however, the resistance value of the resistance element easily fluctuates due to the manufacturing steps, particularly, the displacement of a photoresist pattern layer for defining the resistance element.

Also, when the prior art resistance element is applied to load resistance of a resistance type SRAM cell, if the resistance value of one of the load resistors is increased and the resistance value of the other is decreased, so that the resistance values of the load resistors are unbalanced, the data retention characteristics are deteriorated. Further, in the SRAM cell, a current always flows through one of the load resistors. Such a current is determined by a smaller one of the resistance values of the load resistors. Also, the larger the above-mentioned current, the greater the power dissipation of the entire SRAM device. Therefore, in order to reduce the power dissipation, the resistance values of the load resistors have to be larger, even if these resistance values of the load resistors are unbalanced. However, if the resistance values of the load resistors is too large, the standby characteristics and the soft error rate by α rays are deteriorated, and also, the margin of the manufacturing steps is decreased which increases the manufacturing cost.

SUMMARY OF THE INVENTION

It is an object of the present invention to suppress the fluctuation of a resistance value of a resistance element having a flexing portion.

Another object is to provide a resistance type SRAM device formed by stable load resistors having flexing portions and a method for manufacturing such a SRAM device.

According to the present invention, in a resistance element formed by a connection layer including a flexing portion, the connection layer is constructed by a high resistance section including the flexing portion and a low resistance section.

Boundaries between the high resistance section and the low resistance section are approximately in parallel with a bisector of the connection layer at the flexing portion.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art resistance elements will be explained with reference to FIGS. 1, 2A, 2B, 2C, 3, 4, 5A, 5B, 5C, 6A, 6B and 6C.

Figure 1:
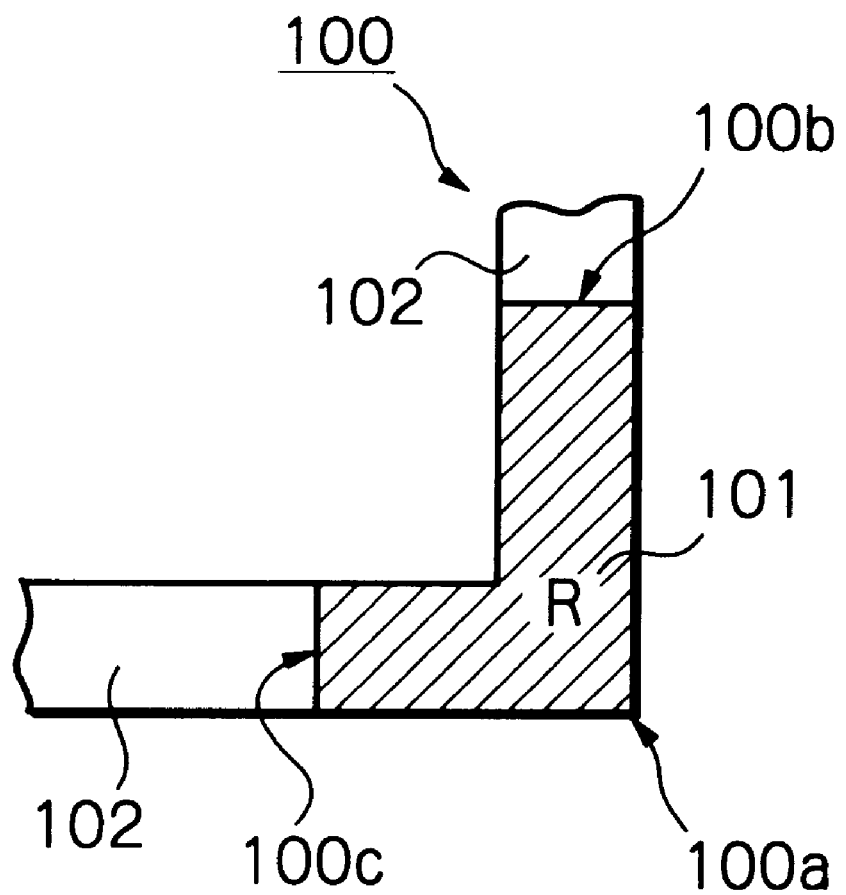
FIG. 1 is a plan view illustrating a prior art resistance element.

In FIG. 1, which illustrates a prior art resistance element, the resistance element is formed by a connection layer 100 having a flexing or bending point 100a divided into a high resistance section 101 and a low resistance section 102. In this case, the high resistance section 101 includes the flexing point 100a. A boundary 100b between the high resistance section 101 and the low resistance section 102 is perpendicular to the connection layer 100, and another boundary 100c between the high resistance section 101 and the low resistance section 102 is also perpendicular to the connection layer 100. The resistance value R of the connection layer 100 is substantially determined by the high resistance section 101.

The connection layer 100 is formed by patterning a impurity-doped polycrystalline silicon layer by using a photoresist pattern layer as a mask and depositing a semi-insulating polycrystalline silicon (SIPOS) layer thereon. Or, the connection layer 100 is formed by patterning an SIPOS layer and implanting ions into the patterned SIPOS layer by using a photoresist pattern layer as a mask (see: JP-A-9-219494).

Figure 2A:
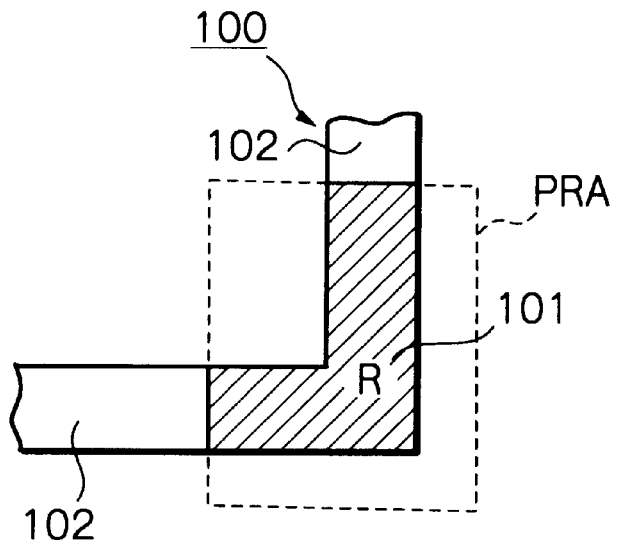
FIGS. 2A, 2B and 2C are plan views of the resistance element of FIG. 1 where a photo resist pattern layer is illustrated.
Figure 2B:
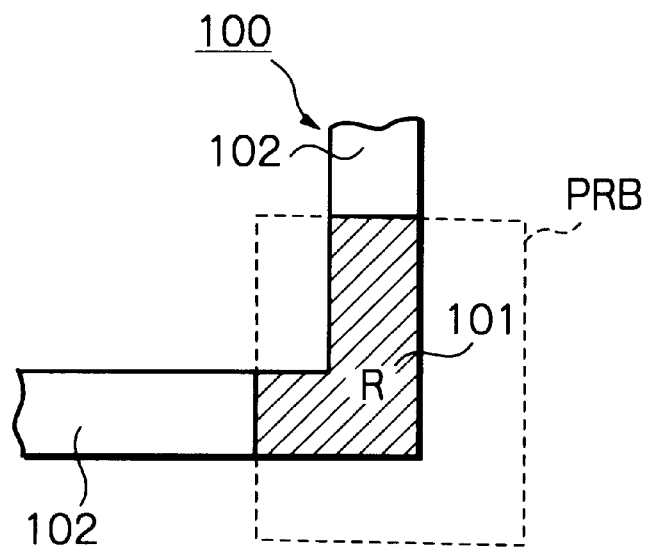
Figure 2C:
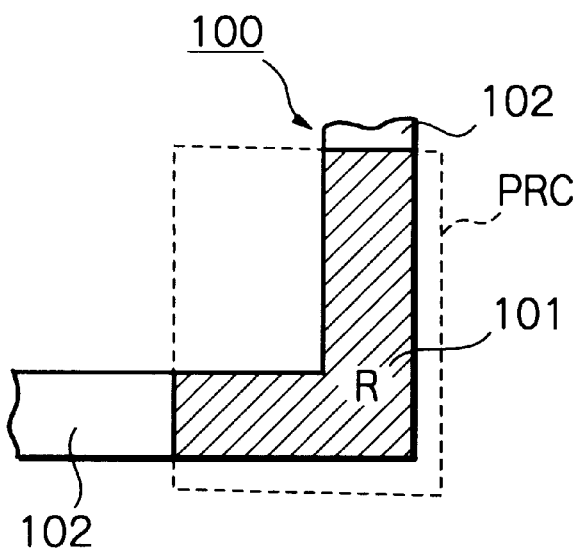

That is as illustrated in FIG. 2A, the above-mentioned photoresist pattern layer is indicated by PRA at a normal position to obtain a resistance value R. However, if the photoresist pattern layer is deviated from the normal position to a position as indicated by PRB in FIG. 2B, where the position is shifted from the normal position to a down side, a right side or a down-right side, the resistance value R is decreased. On the other hand, if the photoresist pattern layer is deviated from the normal position to a position as indicated by PRC in FIG. 2C, where the position is shifted from the normal position to an up side, a left side or a up-left side, the resistance value R is increased.

Figure 3:
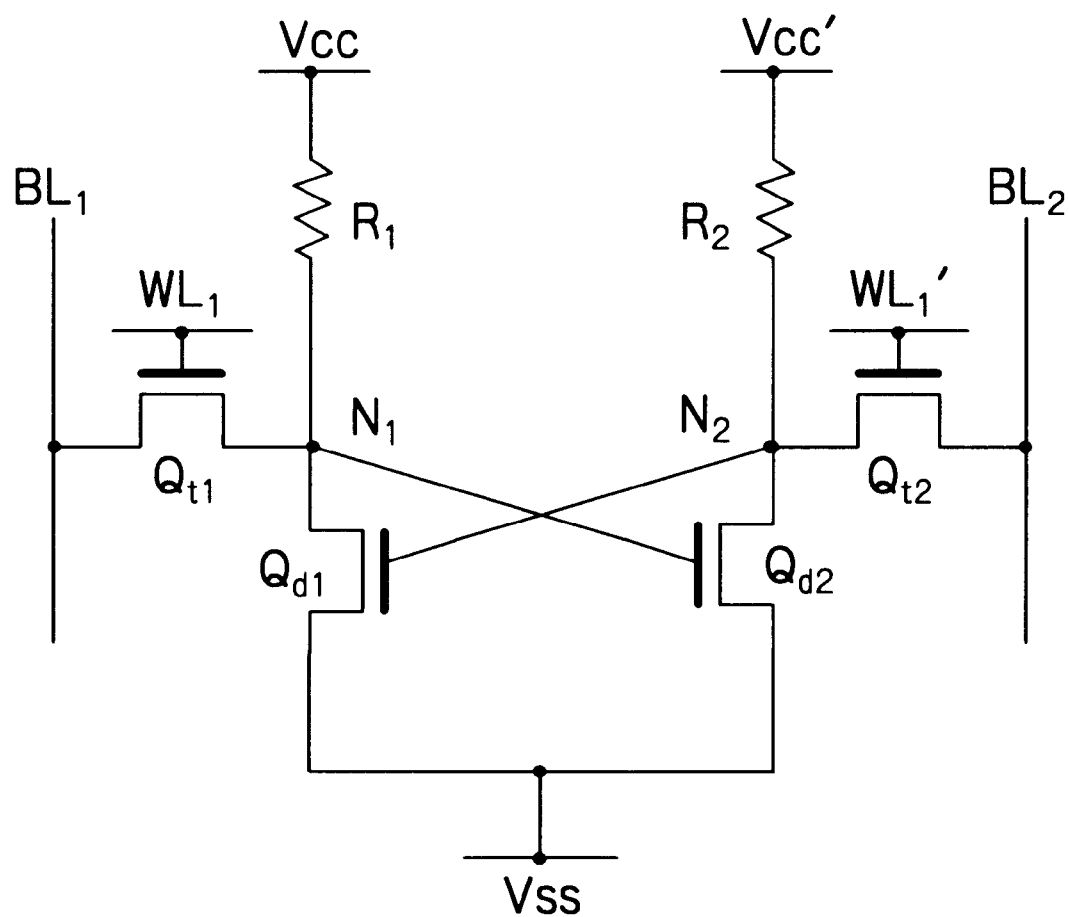
FIG. 3 is an equivalent circuit diagram illustrating a resistance load type SRAM cell.

The resistance element of FIG. 1 is applied to a resistance load type SRAM cell as illustrated in FIG. 3. That is, one SRAM cell is provided at each intersection between word lines $WL_1$ and $WL_1'$ and complementary bit lines $BL_1$ and $BL_2$. This SRAM cell is constructed by a flip-flop formed by two cross-coupled inverters and transfer N-channel MOS transistors $Q_{t1}$ and $Q_{t2}$ connected between nodes $N_1$ and $N_2$ of the flip-flop and the bit lines $BL_1$ and $BL_2$.

The transfer transistors $Q_{t1}$ and $Q_{t2}$ are controlled by the voltages at the word lines $WL_1$ and $WL_2$, respectively. In this case, note that the voltage at the word line $WL_1$ is the same as the voltage at the word line $WL_2$.

Each of the inverters is constructed by a load resistor $R_1$ ($R_2$) and a drive N-channel MOS transistor $Q_{d1}$ ($Q_{d2}$) between a high power supply line $V_{CC}$ ($V_{CC}'$) and a low power supply (ground) line $V_{SS}$. In this case, note that the voltage at the high power supply line $V_{CC}$ is the same as the voltage at the high power supply line $V_{CC}'$. The node $N_1$ is connected to a gate of the drive transistor $Q_{d2}$, so that the drive transistor $Q_{d2}$ is driven by the voltage at the node $N_1$. Similarly, the node $N_2$ is connected to a gate of the drive transistor $Q_{d1}$, so that the drive transistor $Q_{d1}$ is driven by the voltage at the node $N_2$.

As SRAM cells become more fined, the load resistors $R_1$ and $R_2$ have to be more highly stable.

Figure 4:
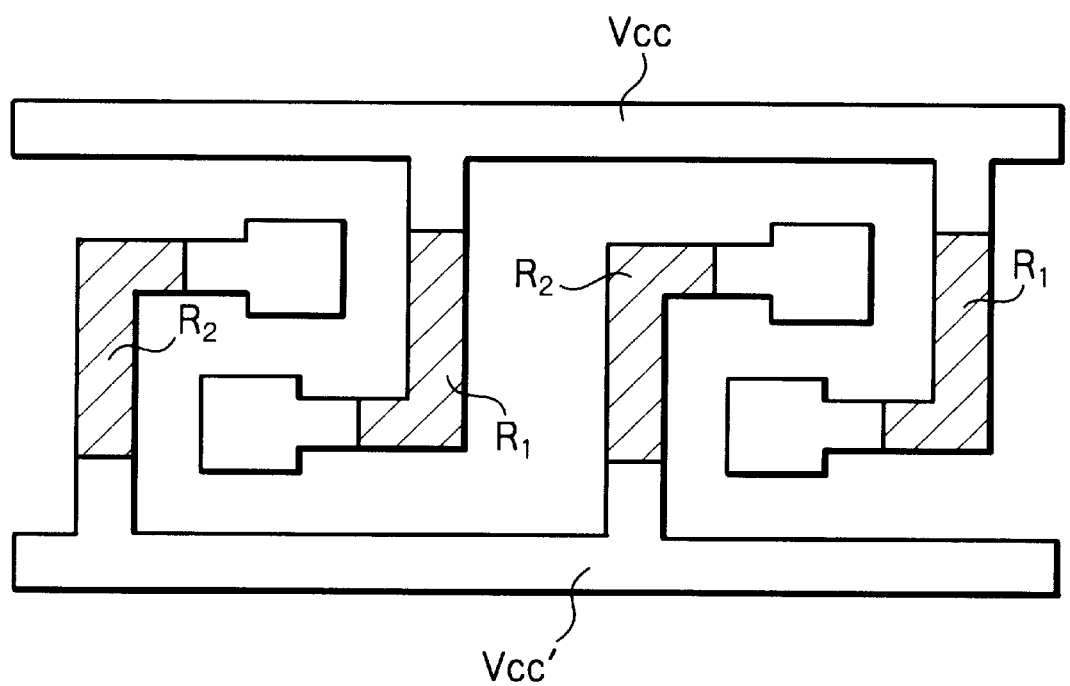
FIG. 4 is a layout diagram of the power supply lines and the load resistors of FIG. 3.

The power supply lines $V_{CC}$ and $V_{CC}'$ and the load resistors $R_1$ and $R_2$ are formed by a connection layer as illustrated in FIG. 4. That is, in order to short the bit lines $BL_1$ and $BL_2$ so that the resistance values thereof are reduced and in order to increase the resistance values of the load resistors $R_1$ and $R_2$, the connection layer of FIG. 4 has extensions each having a flexing point for forming each of the load resistors $R_1$ and $R_2$. Thus, the resistance element of FIG. 1 is applied to the load resistors $R_1$ and $R_2$ of FIG. 4.

A first method for manufacturing the power supply lines $V_{CC}$ and $V_{CC}'$ and the load resistors $R_1$ and $R_2$ is explained next with reference to FIGS. 5A, 5B and 5C.

Figure 5A:
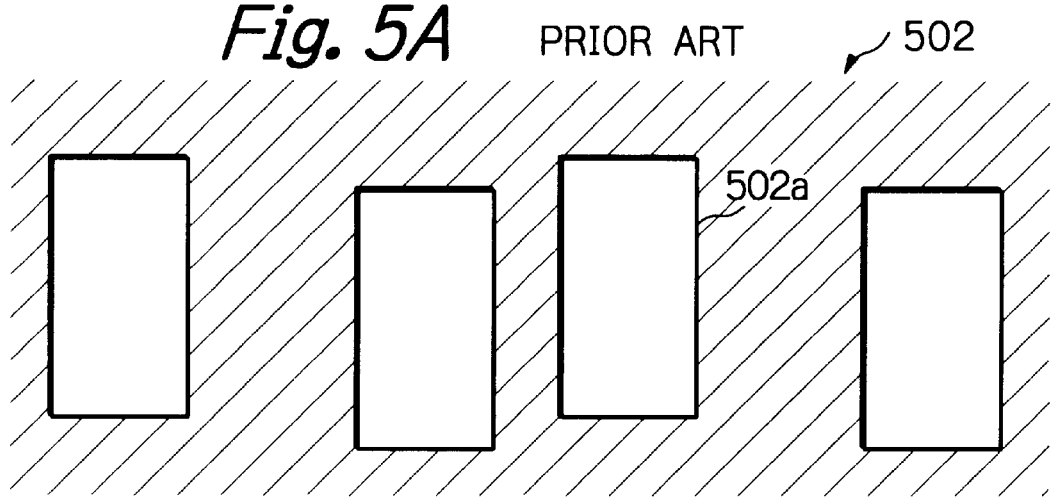
FIGS. 5A, 5B and 5C are plan views for explaining a first method for manufacturing the power supply lines and the load resistors of FIG. 4.

First, referring to FIG. 5A, a phosphorus or arsenic doped polycrystalline silicon layer 501 (shown not in FIG. 5A, but shown in FIG. 5B) is deposited on the entire surface, and then, a photo resist layer 502 having openings 502a is formed on the polycrystalline silicon layer 501 by a photolithography process. Then, the polycrystalline silicon layer 501 is etched by using the photo resist pattern layer 502 as a mask. Then, the photo resist layer 502 is removed. Thus, the polycrystalline silicon layer 501 having openings 501a as illustrated in FIG. 5B is obtained. Then, a SIPOS layer 503 (shown not in FIG. 5B, but shown in FIG. 5C) is deposited on the entire surface.

Figure 5B:
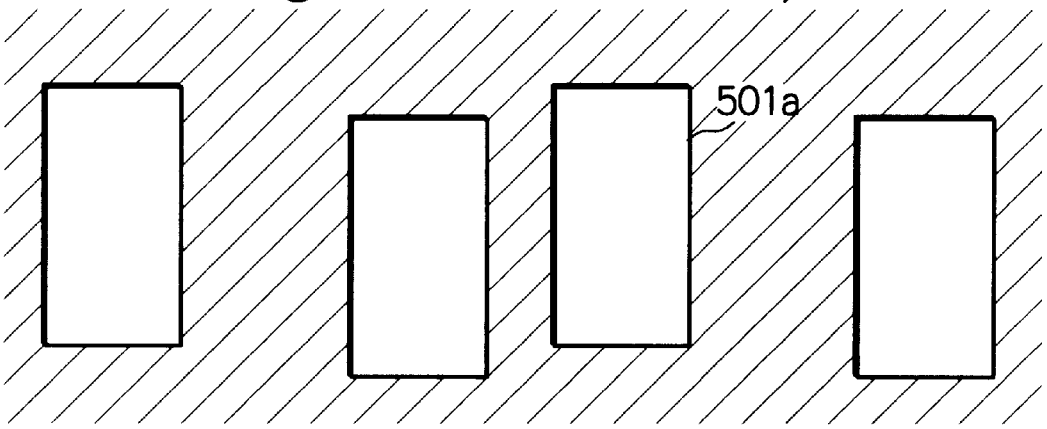
Figure 5C:
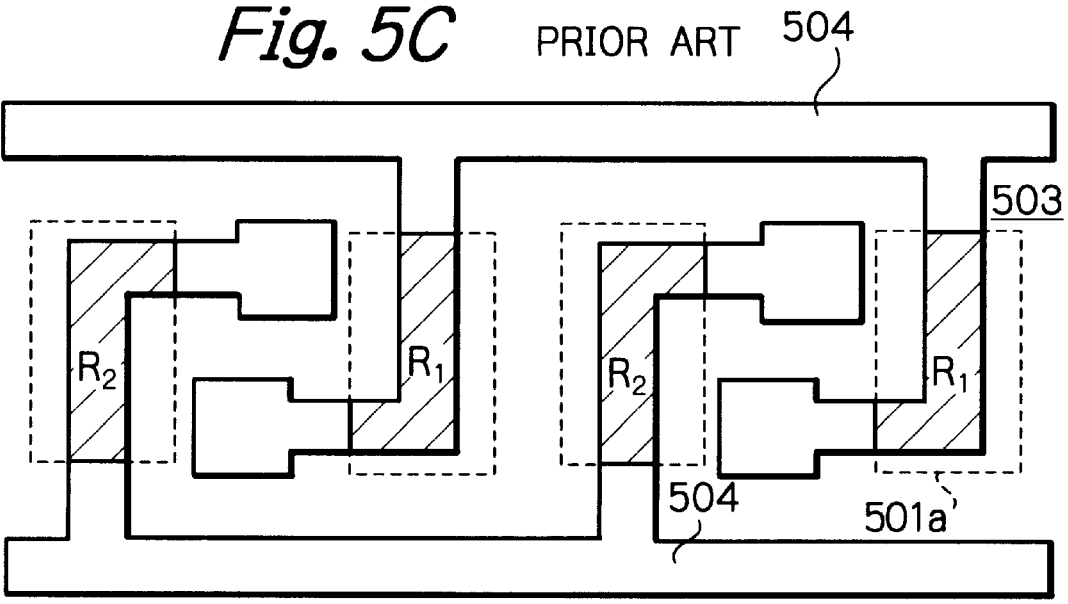

Finally, referring to FIG. 5C, a photo resist pattern layer 504 is formed on the SIPOS layer 503. Then, the SIPOS layer 503 and the polycrystalline silicon layer 501 are etched by using the photo resist pattern layer 504 as a mask, to obtain the power supply lines $V_{CC}$ and $V_{CC}'$ and the load resistors $R_1$ and $R_2$ of FIG. 4. In this case, the load resistors $R_1$ and $R_2$ are formed by only the SIPOS layer 503, and therefore, the resistance values of the load resistors $R_1$ and $R_2$ are large.

In the method as illustrated in FIGS. 5A, 5B and 5C, if the photo resist pattern layer 501 is deviated in relation to the photo resist pattern layer 504 toward a down side, a right side or a down-right side, the resistance value of the load resistor $R_1$ is decreased and the resistance value of the load resistor $R_2$ is increased. On the other side, if the photo resist pattern layer 501 is deviated in relation to the photo resist pattern layer 504 toward an up side, a left side or an up-left side, the resistance value of the load resistor $R_1$ is increased and the resistance value of the load resistor $R_2$ is decreased.

A second method for manufacturing the power supply lines $V_{CC}$ and $V_{CC}'$ and the load resistors $R_1$ and $R_2$ is explained next with reference to FIGS. 6A, 6B and 6C.

Figure 6A:
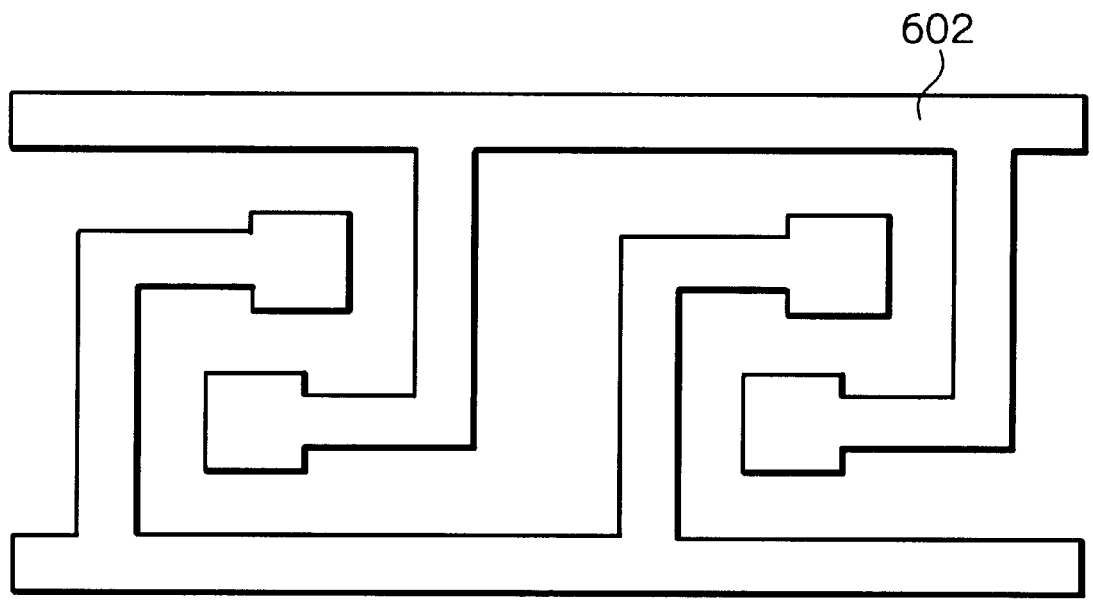
FIGS. 6A, 6B and 6C are plan views for explaining a second method for manufacturing the power supply lines and the load resistors of FIG. 4.

First, referring to FIG. 6A, a SIPOS layer 601 (shown not in FIG. 6A, but shown in FIG. 6B) is deposited on the entire surface, and then, a photo resist pattern layer 602 is formed on the polycrystalline silicon layer 601 by a photolithography process. Then, the layer 601 is etched by using the photo resist pattern layer 602 as a mask. Then, the photo resist layer 602 is removed. Thus, the SIPOS layer 601 as illustrated in FIG. 6B is obtained.

Figure 6B:
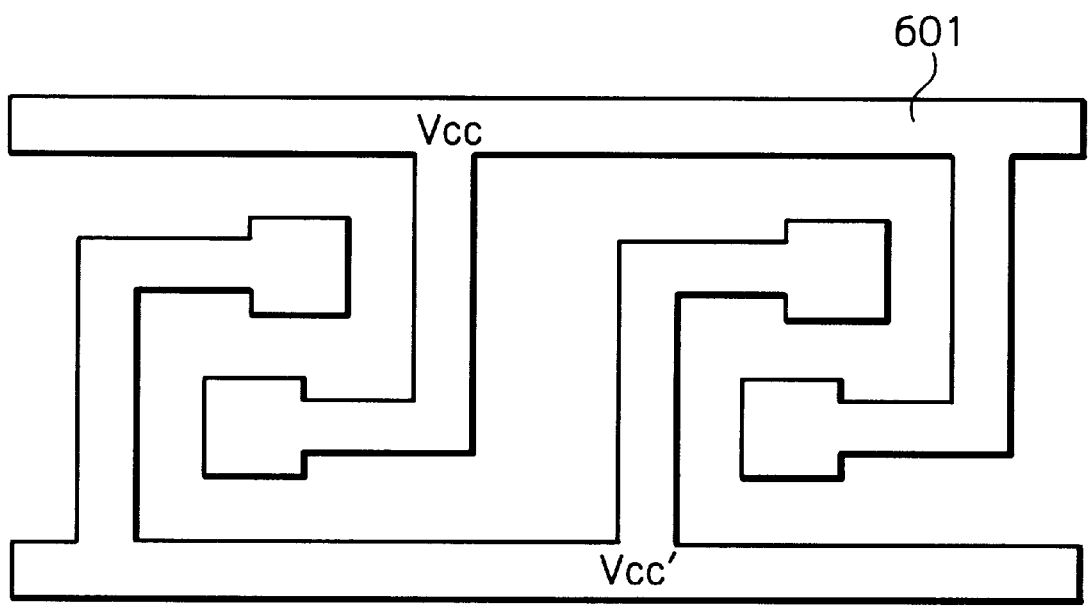
Figure 6C:
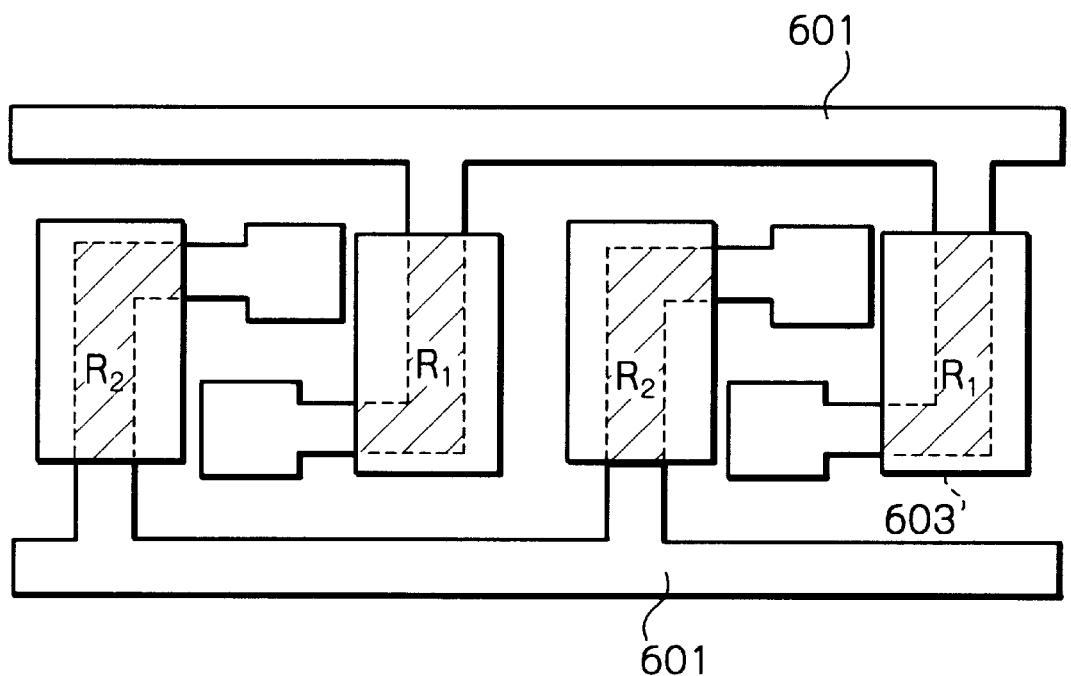

Finally, as illustrated in FIG. 6C, a rectangular photo resist pattern layer 603 is formed on the SIPOS layer 601. Then, impurity ions are implanted into the SIPOS layer 601 by using the photoresist pattern layer 603 as a mask. Then the photoresist pattern layer 603 is removed, to obtain the power supply lines $V_{CC}$ and $V_{CC}'$ and the load resistors $R_1$ and $R_2$ of FIG. 4. In this case, the load resistors $R_1$ and $R_2$ are formed by only the SIPOS layer 601 where the impurity ions were not implanted, and therefore, the resistance values of the load resistors $R_1$ and $R_2$ are large.

In the method as illustrated in FIGS. 6A, 6B and 6C, if the photo resist pattern layer 603 is deviated in relation to the photo resist pattern layer 602 toward a down side, a right side or a down-right side, the resistance value of the load resistor $R_1$ is decreased and the resistance value of the load resistor $R_2$ is increased. On the other side, if the photo resist pattern layer 603 is deviated in relation to the photo resist pattern layer 602 toward an up side, a left side or an up-left side, the resistance value of the load resistor $R_1$ is increased and the resistance value of the load resistor $R_2$ is decreased.

In the SRAM cell of FIG. 4, if the resistance value of one of the load resistors $R_1$ and $R_2$ is increased and the resistance value of the other is decreased, so that the resistance values of the load resistors $R_1$ and $R_2$ are unbalanced, the data retention characteristics are deteriorated. That is, it may be difficult for a write operation to change a first operation state of the SRAM cell to a second operation state of the SRAM cell. Also, the operation states of drive transistors are reversed, so that the second operation state may be changed to the first operation state.

Further, in the SRAM cell, a current always flows through one of the load resistors $R_1$ and $R_2$. Such a current is determined by a smaller one of the resistance values of the load resistors $R_1$ and $R_2$. Also, the larger the above-mentioned current, the greater the power dissipation of the entire SRAM device. Therefore, in order to reduce the power dissipation, the resistance values of the load resistors $R_1$ and $R_2$. have to be larger, even if these resistance values of the load resistors $R_1$ and $R_2$. are unbalanced. However, if the resistance values of the load resistors $R_1$ and $R_2$ is too large, the standby characteristics and the soft error rate by α rays are deteriorated, and also, the margin of the manufacturing steps is decreased which increases the manufacturing cost.

Thus, it is important to reduce the fluctuation of the resistance values of the load resistors $R_1$ and $R_2$ while decreasing the length of the bit lines $BL_1$ and $BL_2$.

Figure 7:
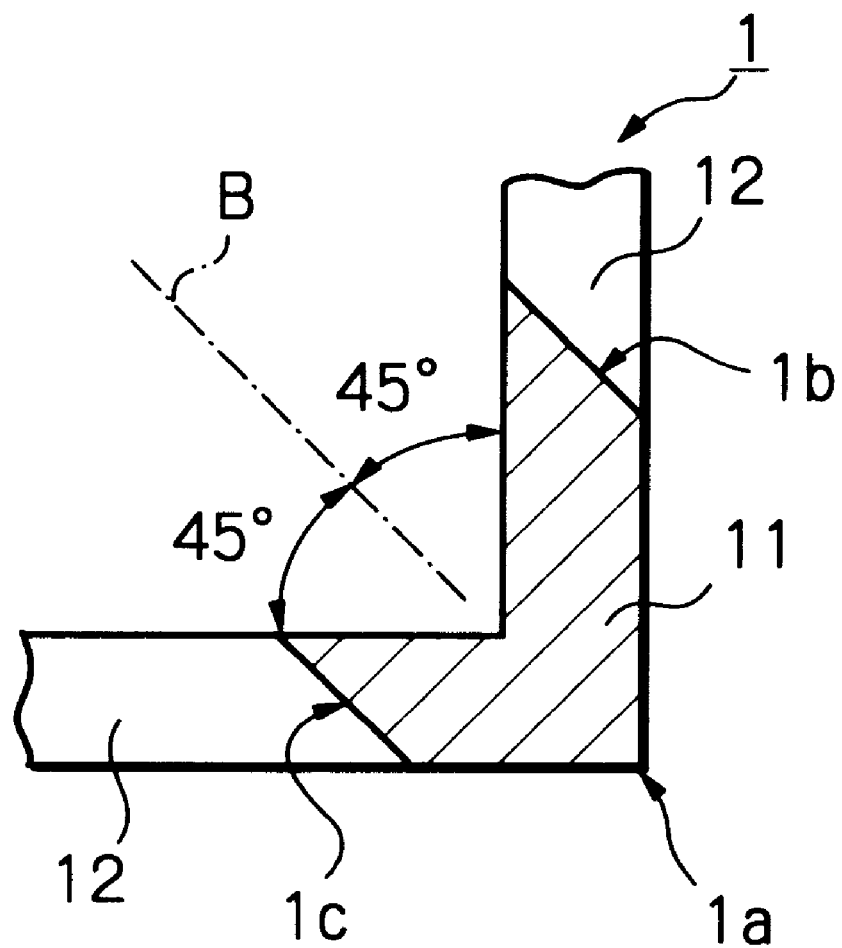
FIG. 7 is a plan view illustrating a first embodiment of the resistance element according to the present invention.

In FIG. 7, which illustrates a first embodiment of the resistance element according to the present invention, the resistance element is formed by a connection pattern layer 1 having a flexing or bending point 1a of 90° and being divided into a high resistance section 11 and a low resistance section 12. In this case, the high resistance section 11 includes the flexing point 1a. A boundary 1b between the high resistance section 11 and the low resistance section 12 is in parallel with another boundary 1c between the high resistance section 11. Also, the boundaries 1b and 1c are approximately in parallel with a bisector B of the connection pattern layer 1. In this case, the angle of each of the boundaries 1b and 1c and the bisector B is about 45°.

Figure 8A:
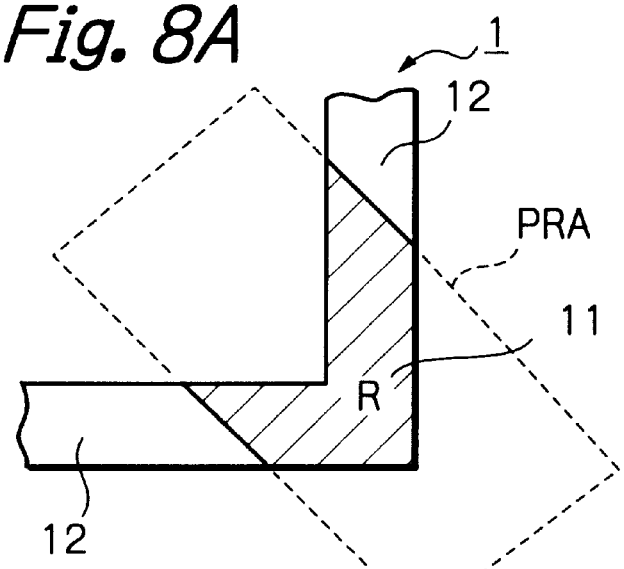
FIGS. 8A, 8B and 8C are plan views of the resistance element of FIG. 7, where a photo resist pattern layer is illustrated.
Figure 8B:
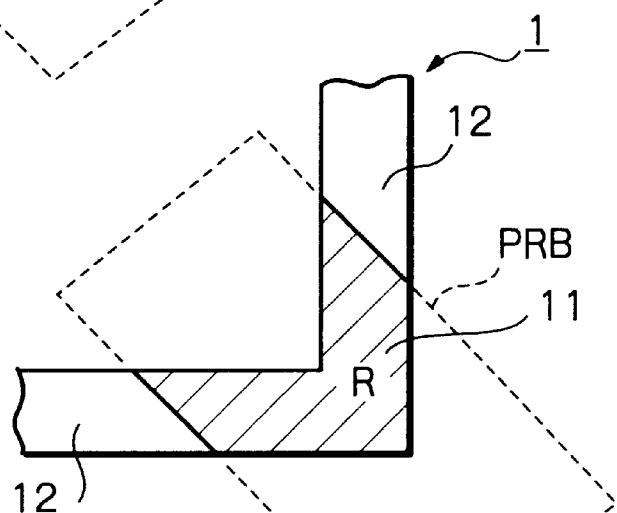
Figure 8C:
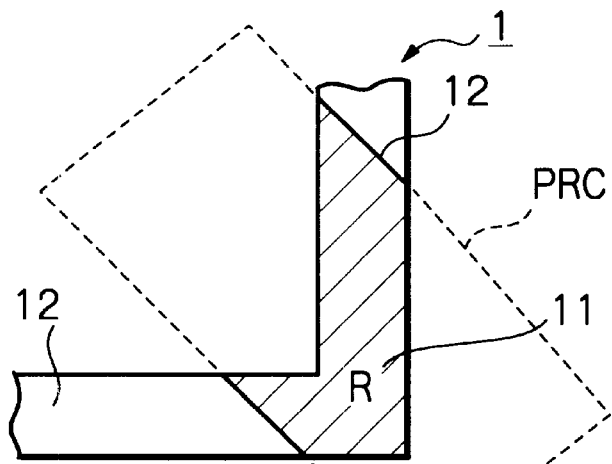

Therefore, as illustrated in FIG. 8A, a photoresist pattern layer for defining the high resistance section 11 is indicated by PRA at a normal position to obtain a resistance value R. Also, if the photoresist pattern layer is deviated from the normal position to a position as indicated by PRB in FIG. 8B, where the position is shifted from the normal position to a down side, a right side or a down-right side, the resistance value R is hardly changed. On the other hand, if the photoresist pattern layer is deviated from the normal position to a position as indicated by PRC in FIG. 8C, where the position is shifted from the normal position to an up side, a left side or a up-left side, the resistance value R is also hardly changed.

Figure 9A:
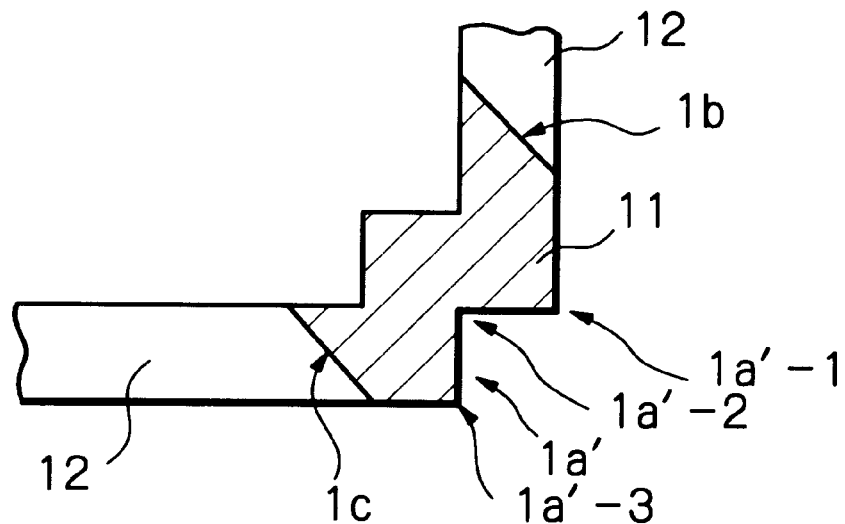
FIGS. 9A and 9B are plan views llustrating modifications of the resistance element of FIG. 7.
Figure 9B:
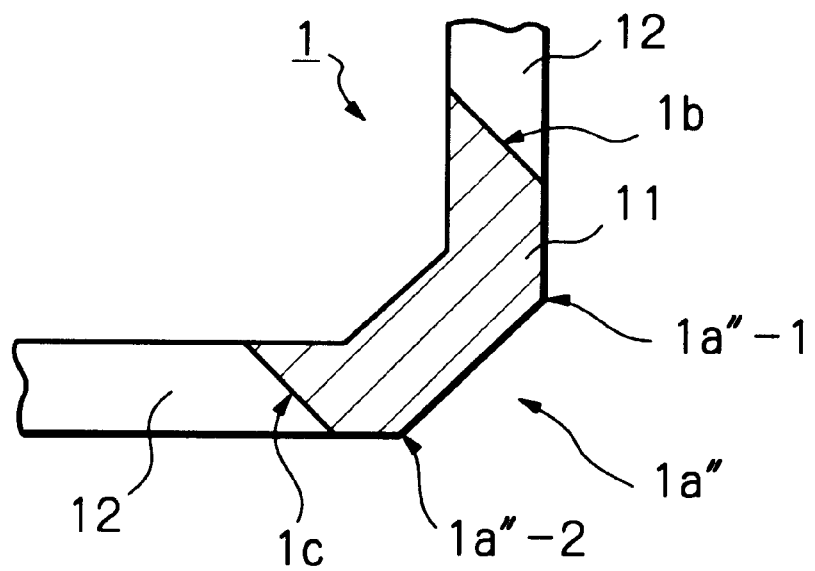

The flexing point 1a of FIG. 7 is modified to flexing point portions 1a' and 1a" as illustrated in FIGS. 9A and 9B. In this case, the flexing portion 1a' of FIG. 9A includes three flexing points 1a'-1, 1a'-2 and 1a'-3 and the flexing portion 1a" includes two flexing points 1a"-1 and 1a"-2. Note that the flexing points 1a, 1a' and 1a" are all included in the high resistance section 11.

Figure 10:
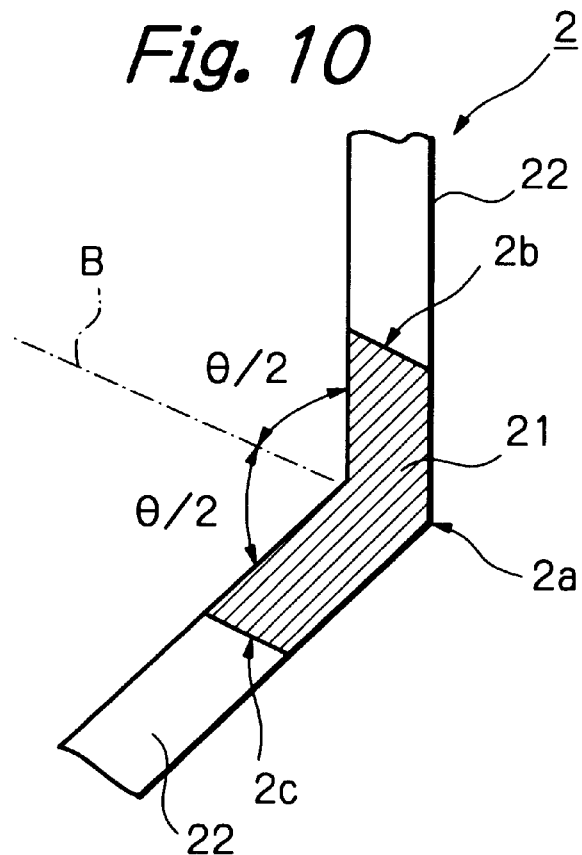
FIG. 10 is a plan view illustrating a second embodiment of the resistance element according to the present invention.

In FIG. 10, which illustrates a second embodiment of the resistance element according to the present invention, the resistance element is formed by a connection pattern layer 2 having a flexing point 2a of an obtuse angle θ and being divided into a high resistance section 21 and a low resistance section 22. In this case, the high resistance section 21 includes the flexing point 2a. A boundary 2b between the high resistance section 21 and the low resistance section 22 is in parallel with another boundary 2c between the high resistance section 21. Also, the boundaries 2b and 2c are approximately in parallel with a bisector B of the connection pattern layer 2. In this case, the angle of each of the boundaries 2b and 2c and the bisector B is about θ/2 where θ is angle of the connection pattern layer 2 at the flexing point 2a.

Even in the resistance element of FIG. 10, the resistance value R of the high resistance section 21 hardly fluctuates in the same way as the counterpart section 11 of FIG. 7.

Figure 11:
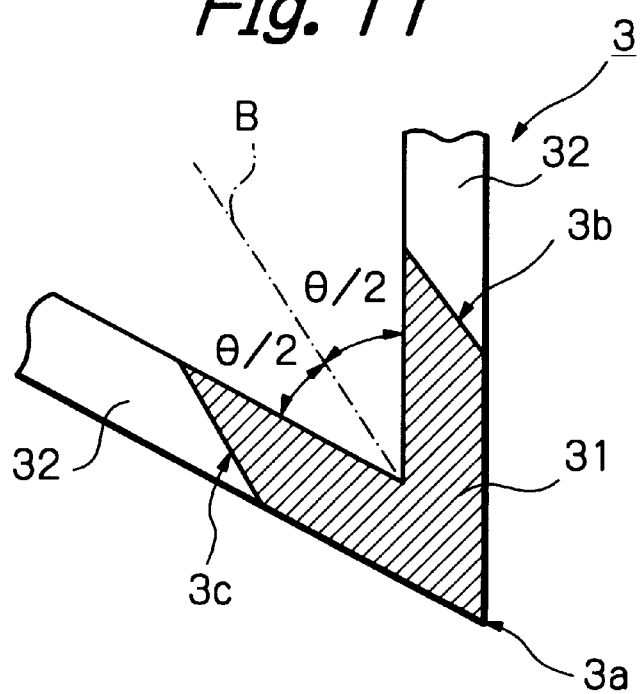
FIG. 11 is a plan view illustrating a third embodiment of the resistance element according to the present invention.

In FIG. 11, which illustrates a third embodiment of the resistance element according to the present invention, the resistance element is formed by a connection pattern layer 3 having a flexing point 2a of an acute angle θ and being divided into a high resistance section 31 and a low resistance section 32. In this case, the high resistance section 31 includes the flexing point 3a. A boundary 3b between the high resistance section 31 and the low resistance section 32 is in parallel with another boundary 3c between the high resistance section 31. Also, the boundaries 3b and 3c are approximately in parallel with a bisector B of the connection pattern layer 3. In this case, the angle of each of the boundaries 3b and 3c and the bisector B is about θ/2 where θ is angle of the connection pattern layer 3 at the flexing point 3a.

Even in the resistance element of FIG. 11, the resistance value R of the high resistance section 31 hardly fluctuates in the same way as the counterpart section 11 of FIG. 7.

In FIGS. 7, 9A, 9B 10 and 11 an angle between the bisector B and each of the boundaries 1b, 1c, 2b, 2c, 3b and 3c is within ±10°, and is preferably within ±5°. Also, the connection pattern layers 1, 2 and 3 can be manufactured in the same way as the connection pattern layer 100 of FIG. 1.

The resistance element of FIG. 7 is applied to a resistance type SRAM cell whose equivalent circuit diagram is illustrated in FIG. 3.

A first method for manufacturing the resistance type SRAM cell according to the present invention is explained next with reference to FIGS. 12A through 12G and FIGS. 13 through 21.

Figure 12A:
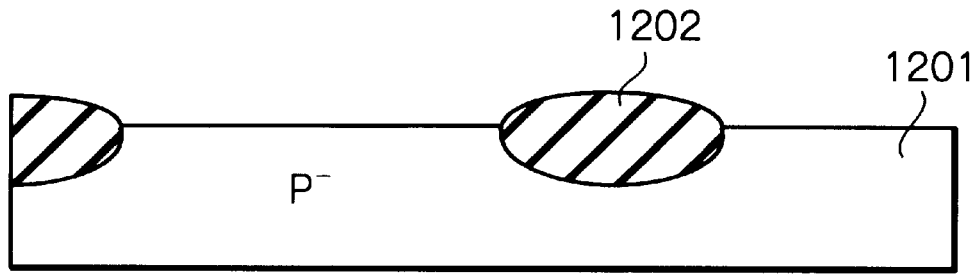
FIGS. 12A through 12G are cross-sectional views for explaining a first method for manufacturing the resistance type SRAM cell to which the resistance element of FIG. 7 is applied.

First, referring to FIG. 12A, a P-type monocrystalline silicon substrate 1201 is thermally oxidized by using a local oxidation of silicon (LOCOS) process to form an about 200 to 500 nm thick field silicon oxide layer 1202.

Figure 12B:
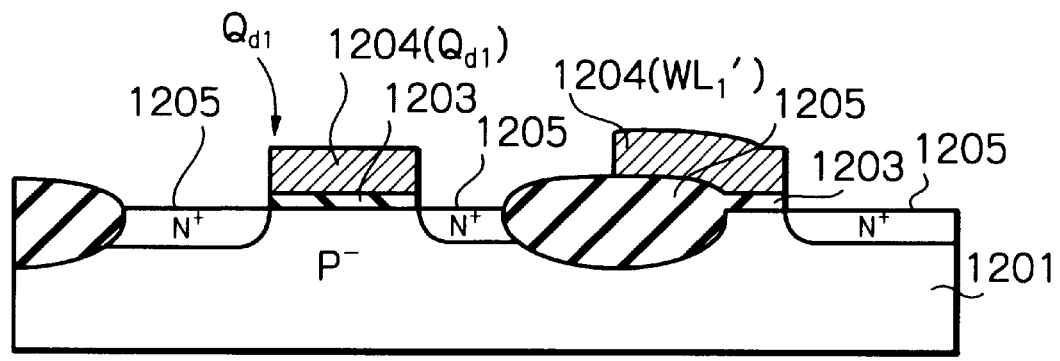
Figure 13:
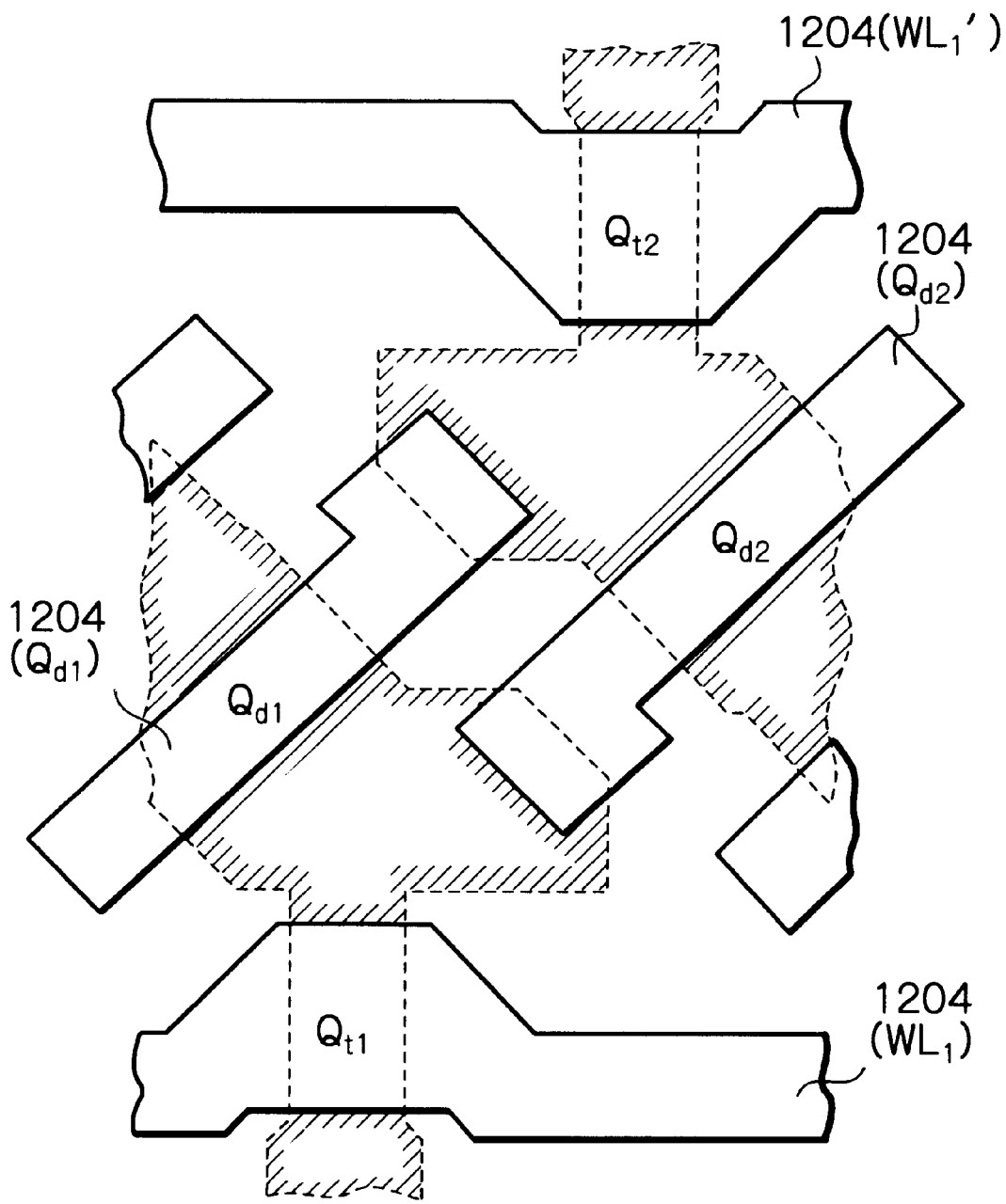
FIGS. 13 through 20 are plan views for supplementarily explaining the first manufacturing method as illustrated in FIGS. 12A through 12G.

Next, referring to FIG. 12B, an about 3 to 10 nm thick gate silicon oxide layer 1203 is formed by thermally oxidizing the substrate 1201. Then, an about 50 to 300 nm thick conductive layer 1204 formed by a polycrystalline silicon layer and a refractory metal layer is formed on the gate silicon oxide layer 1203 and the field silicon oxide layer 1202. Then, the conductive layer 1204 is patterned by a photolithography and etching process to form the gate electrode of the transistors $Q_{t1}$, $Q_{t2}$, $Q_{d1}$ and $Q_{d2}$. Then, impurity ions are implanted into the substrate 1201 by using the conductive layer 1204 as a mask to form N-type impurity regions 1205. A plan view of FIG. 12B is illustrated in FIG. 13.

Figure 14:
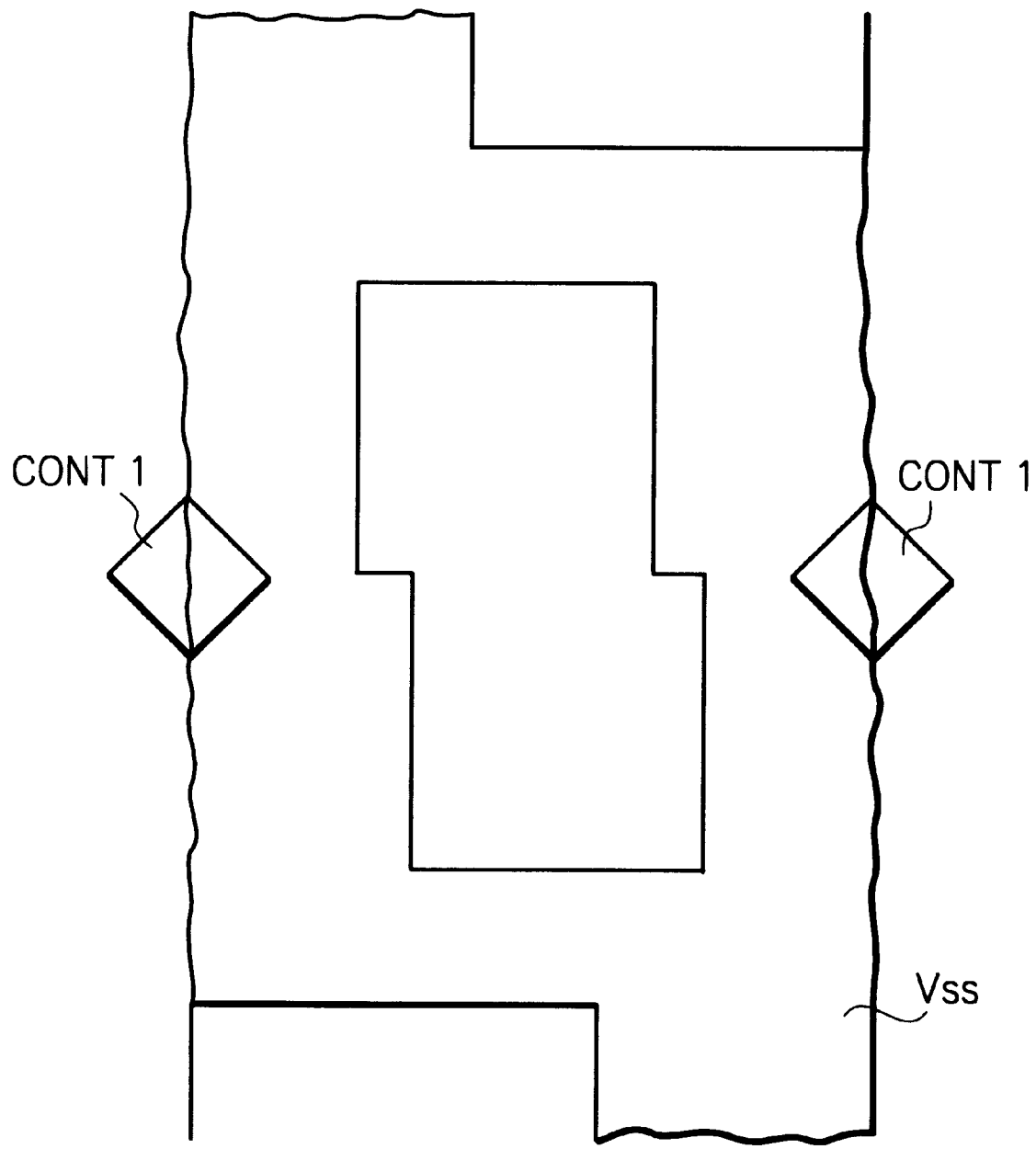

Next, referring to FIG. 14, an insulating layer (not shown) is formed on the entire surface. Then, a ground contact hole CONT1 is perforated in the insulating layer. Then, a conductive layer is deposited on the insulating layer and is patterned to form a ground line $V_{SS}$ connected via the ground contact hole CONT1 to the sources of the drive transistors $Q_{d1}$ and $Q_{d2}$.

Figure 12C:
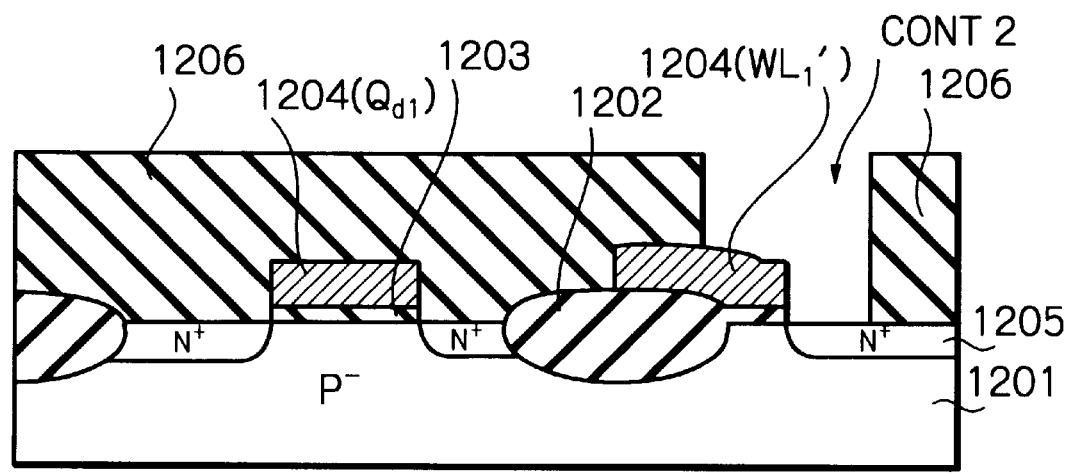

Next, referring to FIG. 12C, an insulating layer 1206 is formed on the entire surface.

Figure 15:
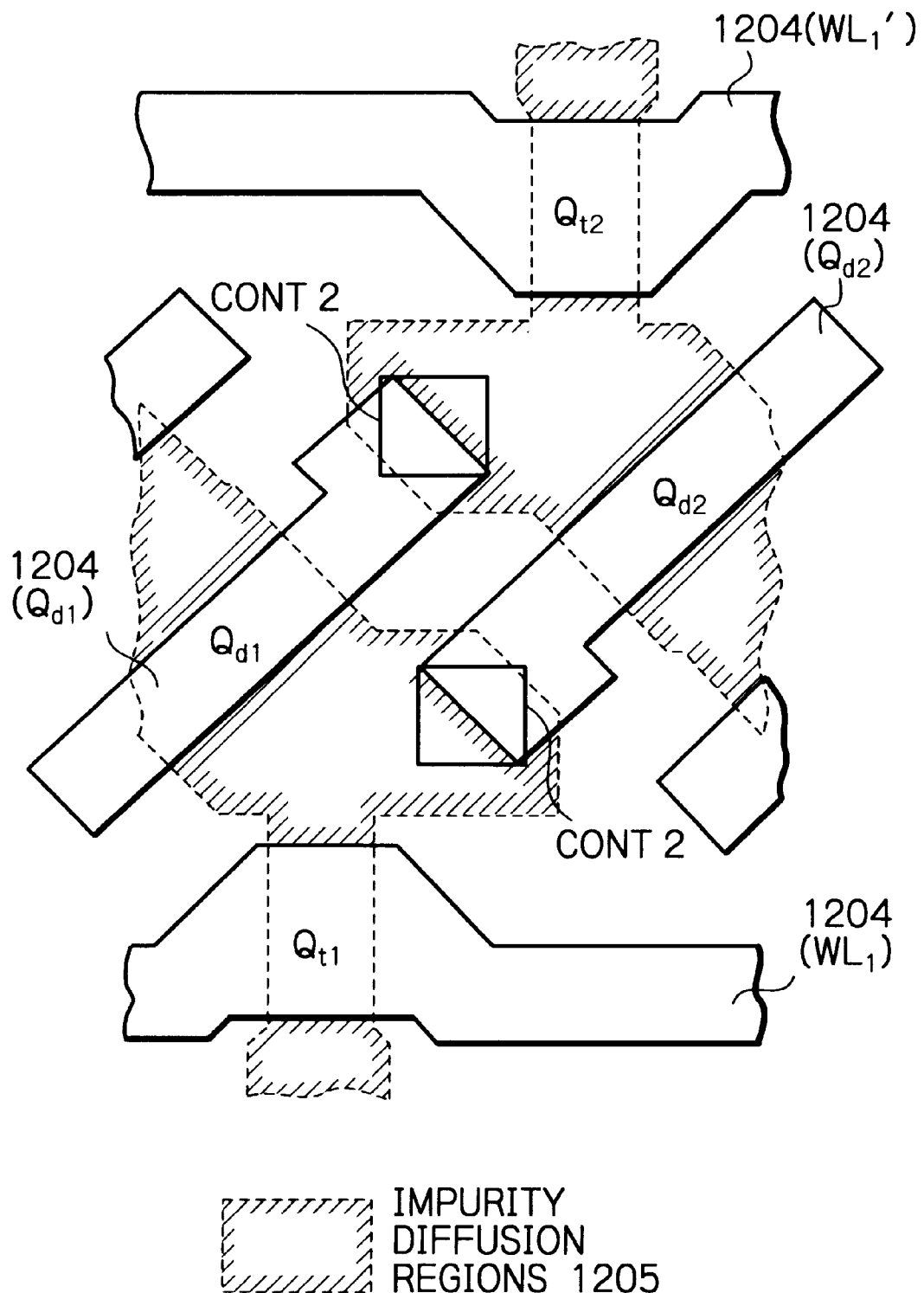

Note that the insulating layer 1206 of FIG. 12C also includes the insulating layer under the ground line $V_{SS}$. Then a shared contact hole CONT2 is perforated in the insulating layer 1206. A plan view of FIG. 12C is illustrated in FIG. 15.

Figure 12D:
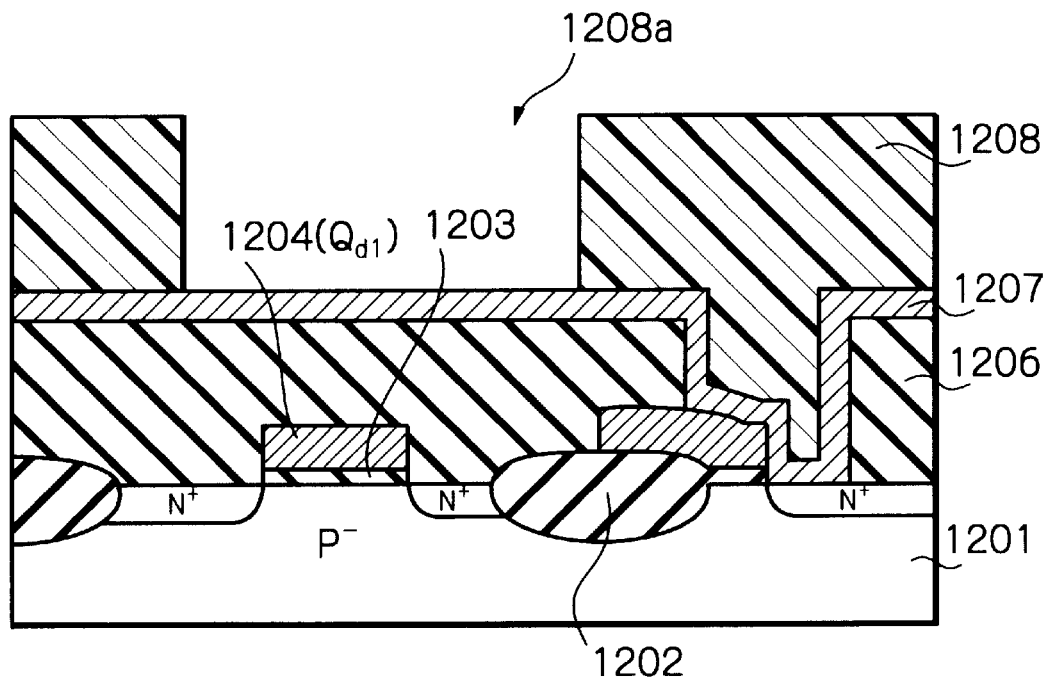
Figure 16:
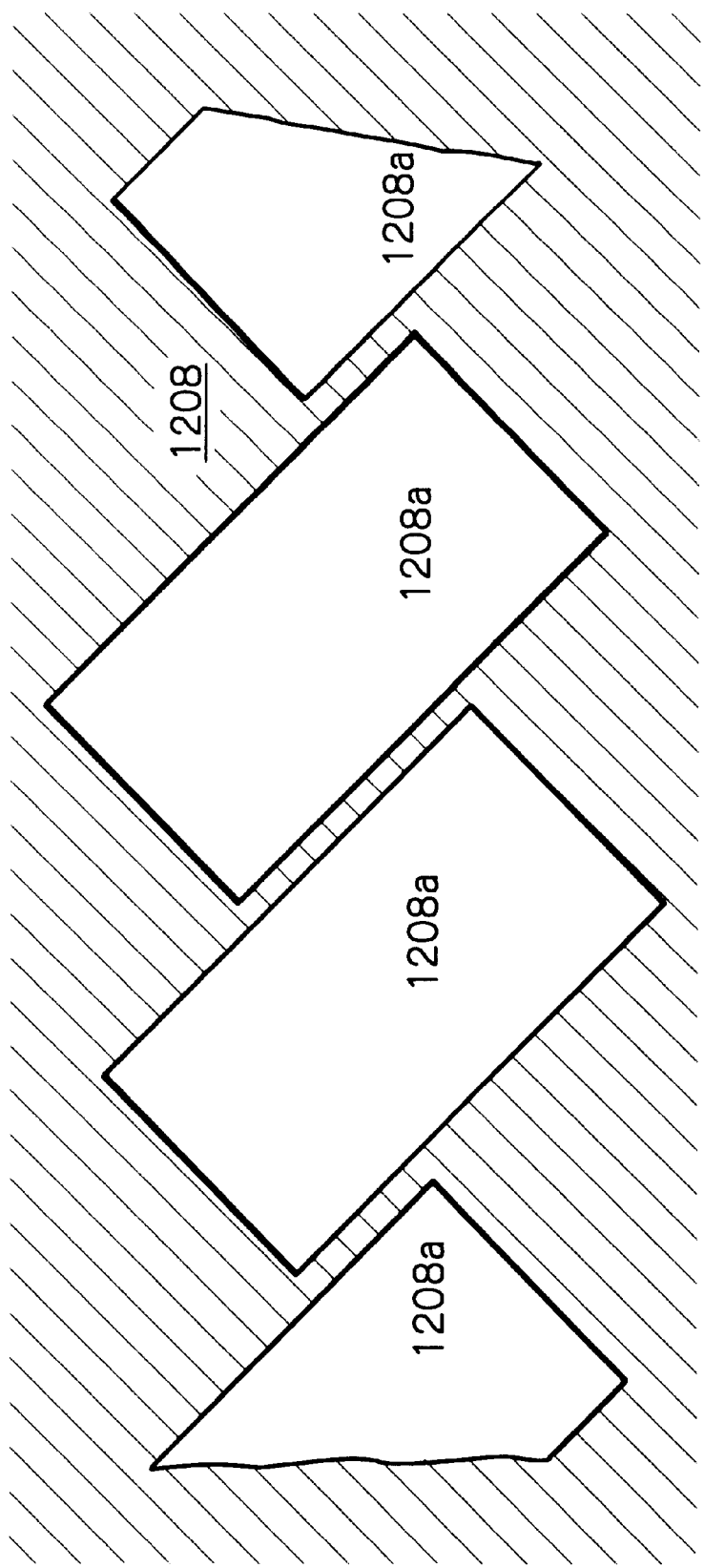

Next, referring to FIG. 12D, an about 30 to 100 nm thick phosphorus- or arsenic-doped polycrystalline silicon layer 1207 is deposited on the entire surface by using a chemical vapor deposition (CVD) process. In this case, the introduction of impurities in the polycrystalline silicon layer 1207 is carried out simultaneously with the deposition of polycrystalline silicon or after the deposition of polycrystalline silicon. Also, the concentration of impurities in the polycrystalline silicon layer 1207 is about $1 \times 10^{19}$ to $1 \times 10^{22}$ atm/cm$^3$, and therefore, the resistivety of the polycrystalline silicon layer 1207 is low. Then, a photoresist pattern layer 1208 having openings 1208a as illustrating in FIG. 16 is formed on the polycrystalline silicon layer 1207.

Figure 12E:
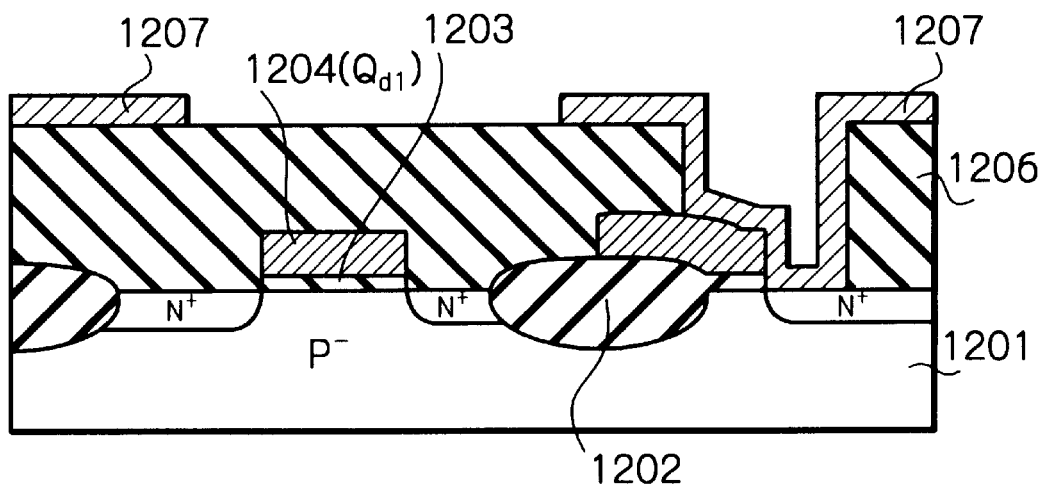

Next, referring to FIG. 12E, the polycrystalline silicon layer 1207 is etched by using the photo resist pattern layer 1208 as a mask. Then, the photo resist pattern layer 1208 is removed.

Figure 12F:
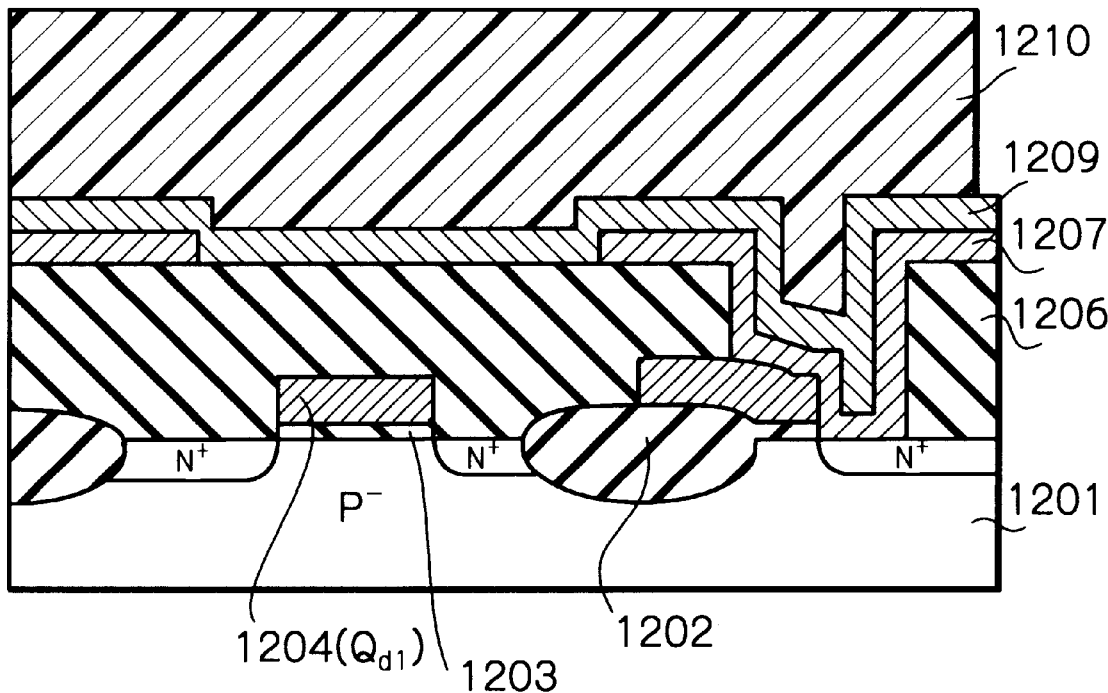
Figure 12G:
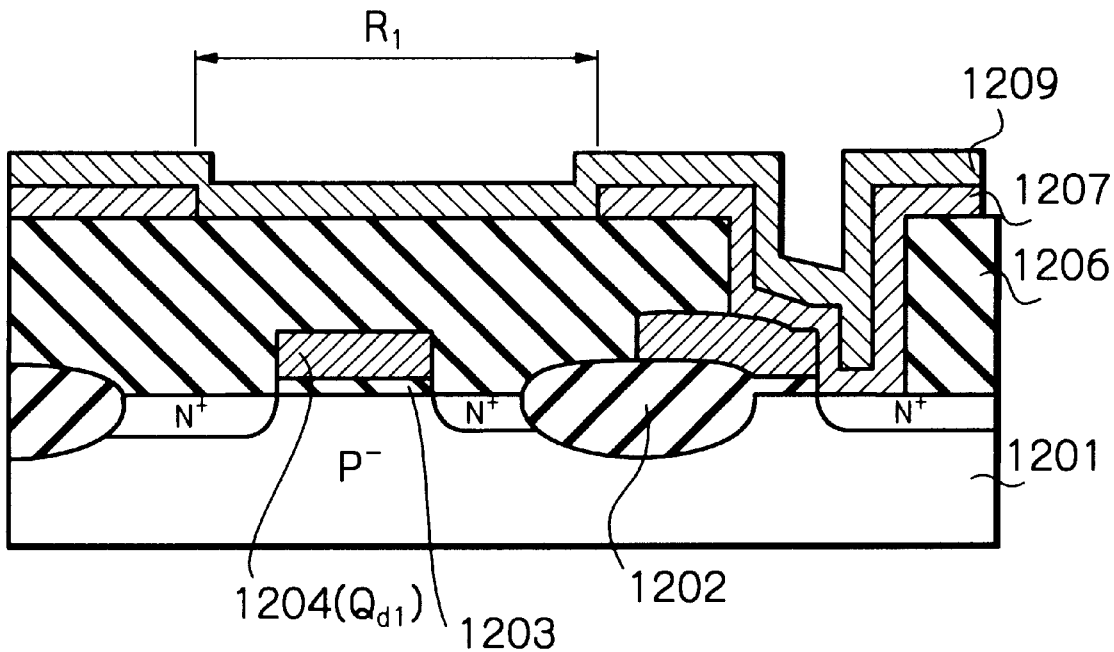
Figure 17:
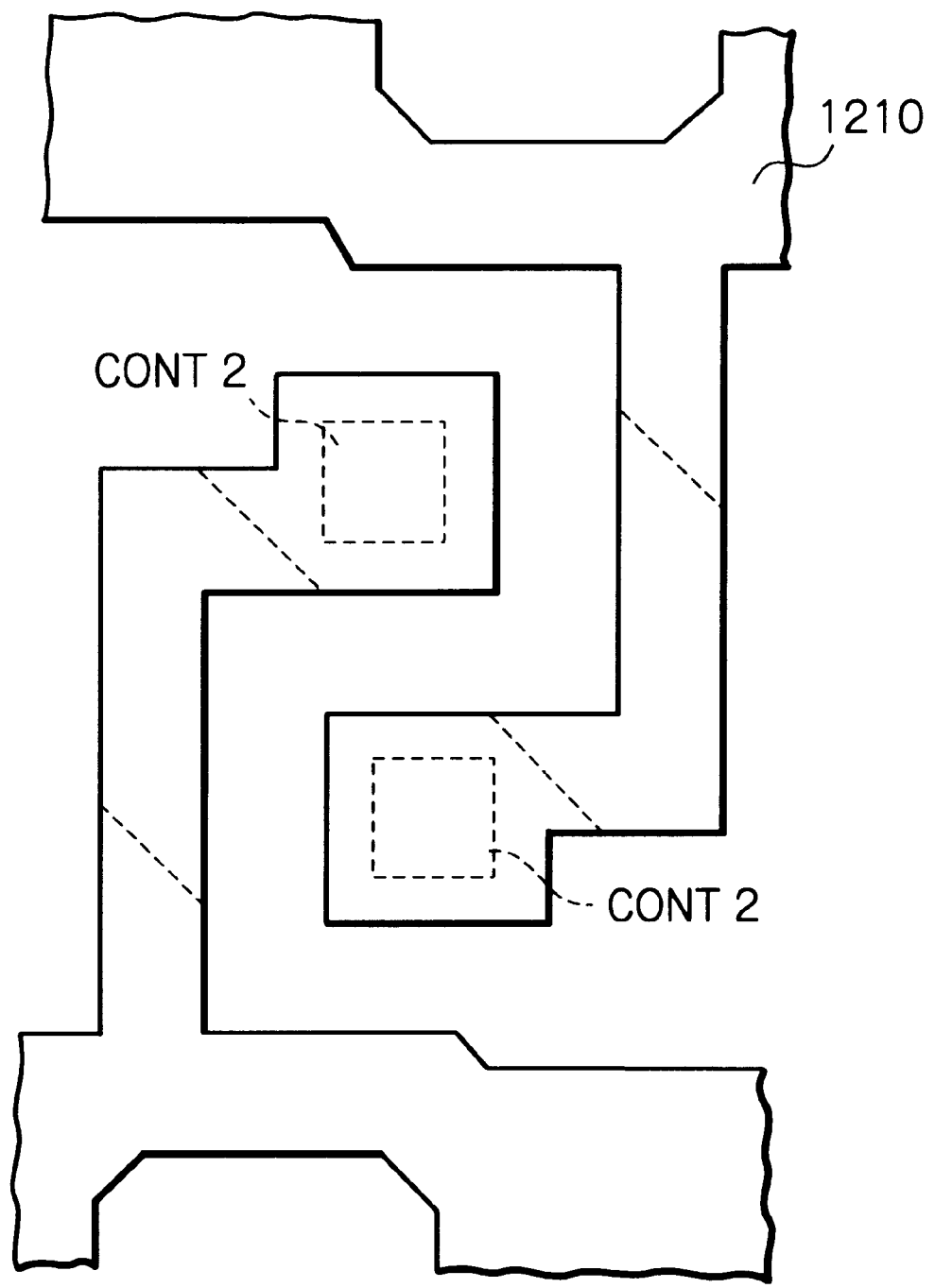
Figure 18:
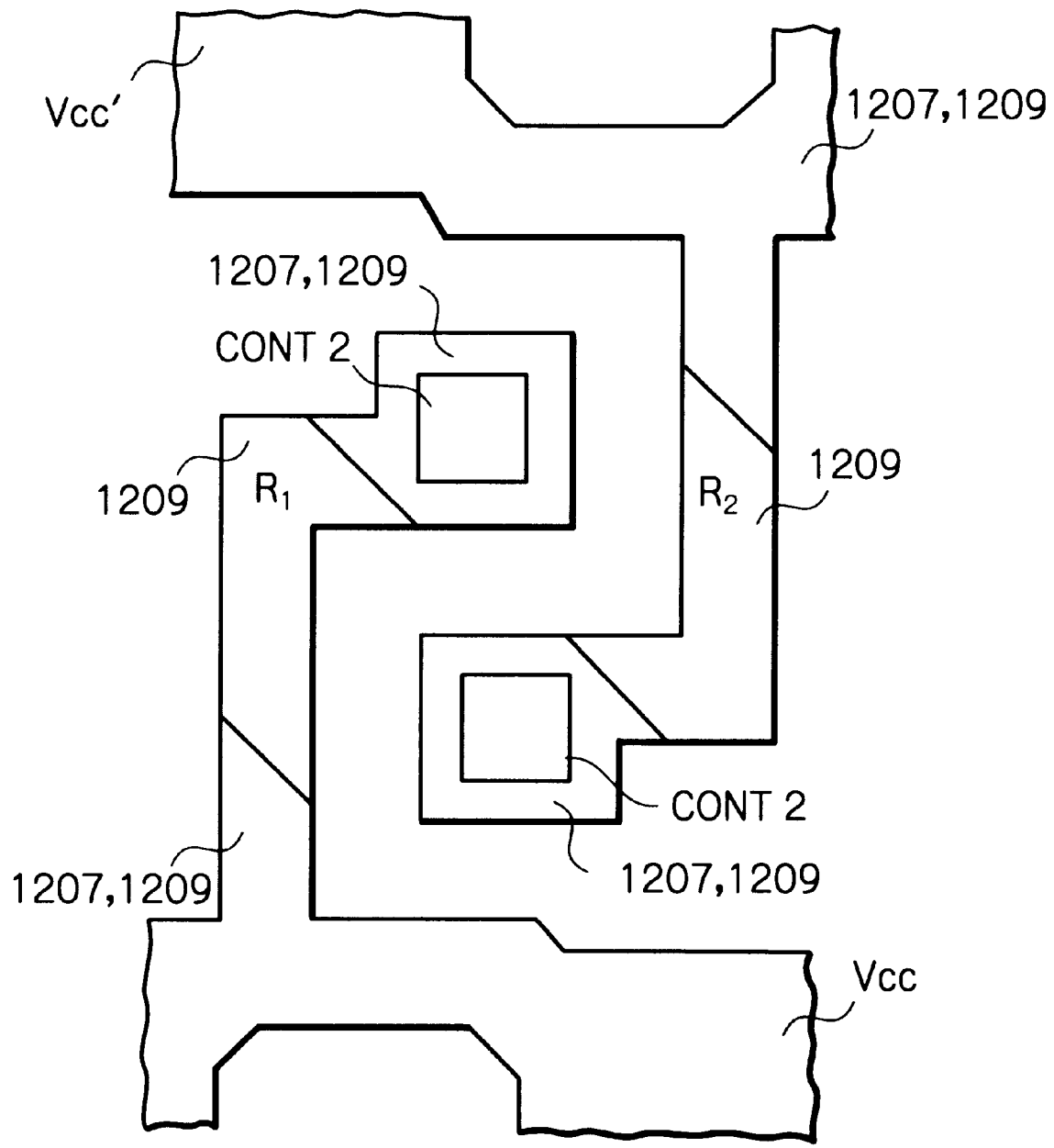

Next, referring to FIG. 12F, an about 20 to 50 nm thick high resistance layer 1209 made of non-doped polycrystalline silicon or SIPOS is deposited on the entire surface. SIPOS is formed using a CVD process by a mixture gas of SiH$_4$ and N$_2$O. Then, a photo resist pattern layer 1210 as illustrated in FIG. 17 is formed Next, referring to FIG. 12G, the high resistance layer 1209 and the polycrystalline silicon layer 1207 are etched by using the photo resist pattern layer 1210 as a mask. Then, the photo resist pattern layer 1210 is removed. A plan view of FIG. 12G is illustrated in FIG. 18. That is, the load resistors R$_1$ and R$_2$ are made of only the high resistance layer 1208, while the power supply lines V$_{CC}$ and V$_{CC}$' are made of the impurity-doped polycrystalline silicon layer 1207 as well as the high resistance layer 1209.

Figure 19:
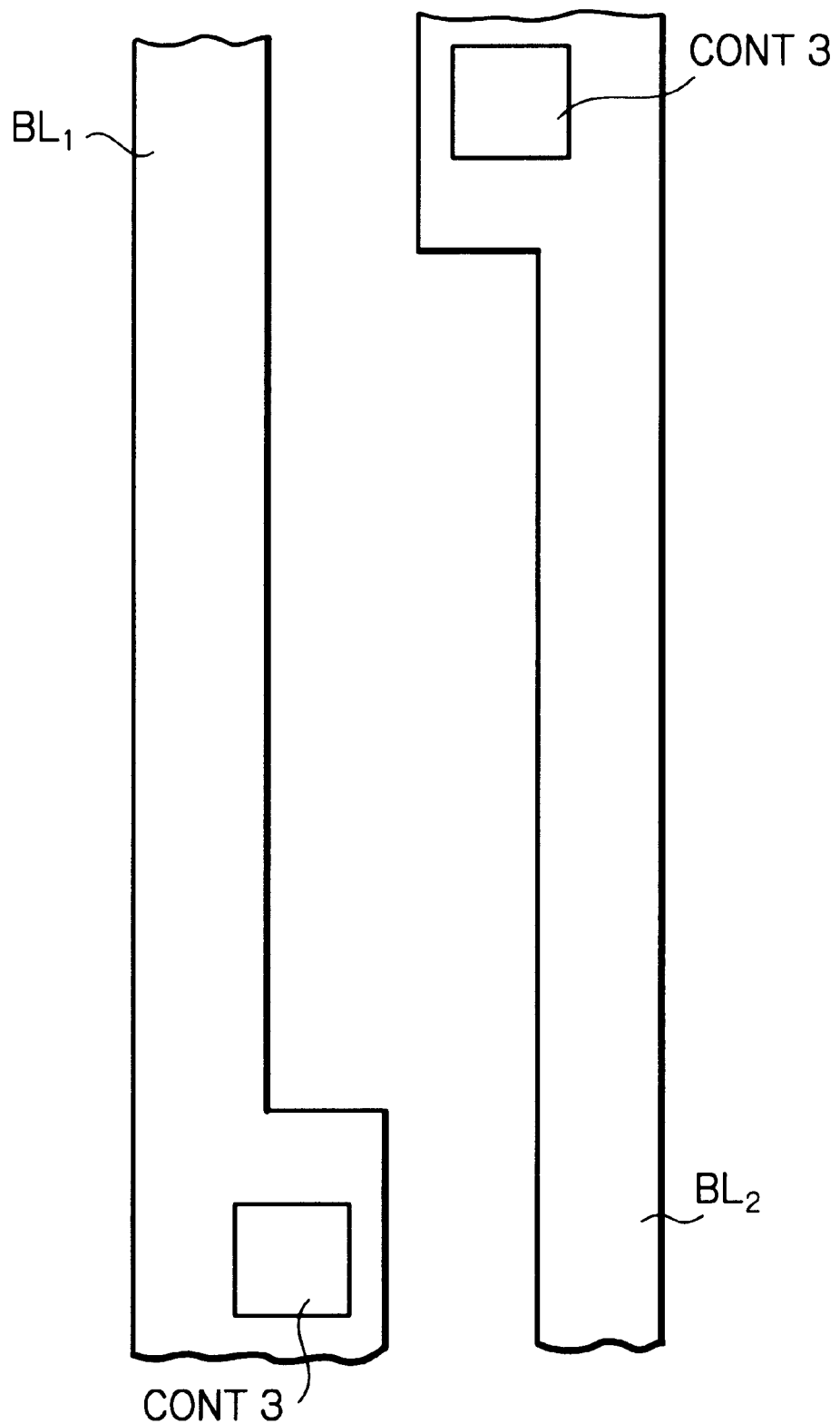

Finally, referring to FIG. 19, an insulating layer (not shown) is deposited on the entire surface, and a bit contact hole CONT3 is perforated in the insulating layer. Then, a conductive layer made of aluminum or the like is deposited and is patterned to form bit lines BL$_1$ and BL$_2$.

Figure 20:
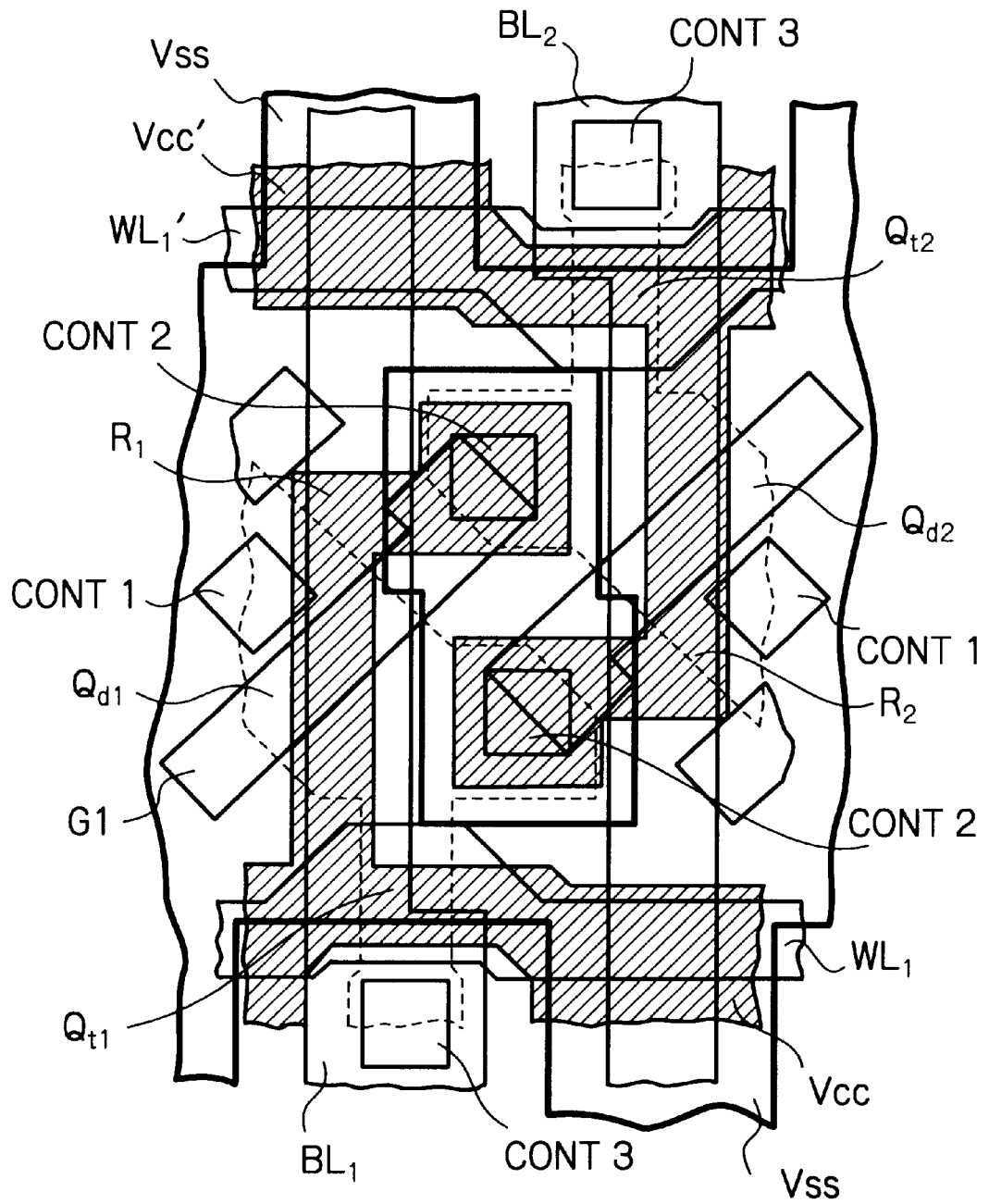

Thus, a resistance type SRAM cell as illustrating in FIG. 20 is obtained.

In the first resistance type SRAM cell manufacturing method as illustrated in FIGS. 12A through 12G and FIGS. 13 through 20 since the resistance element of FIG. 7 is applied to the load resistors R$_1$ and R$_2$, the resistance values thereof can be prevented from being unbalanced. For example, when each of the load resistors R$_1$ and R$_2$ had a width of about 0.25 μm and a length of 0.8 μm, the resistance values thereof were stably about $10^{11}$ Ω without substantial fluctuation. In addition, since each of the resistor elements R$_1$ and R$_2$ has a flexing point, the resistance values of the bit lines BL$_1$ and BL$_2$ can be decreased. Further, the rated resistance value of the load resistors R$_1$ and R$_2$ can be satisfied without increasing the resistance values of the load to resistors R$_1$ and R$_2$. Still further, the standby characteristics and the soft error rate by α rays can be improved.

Figure 21:
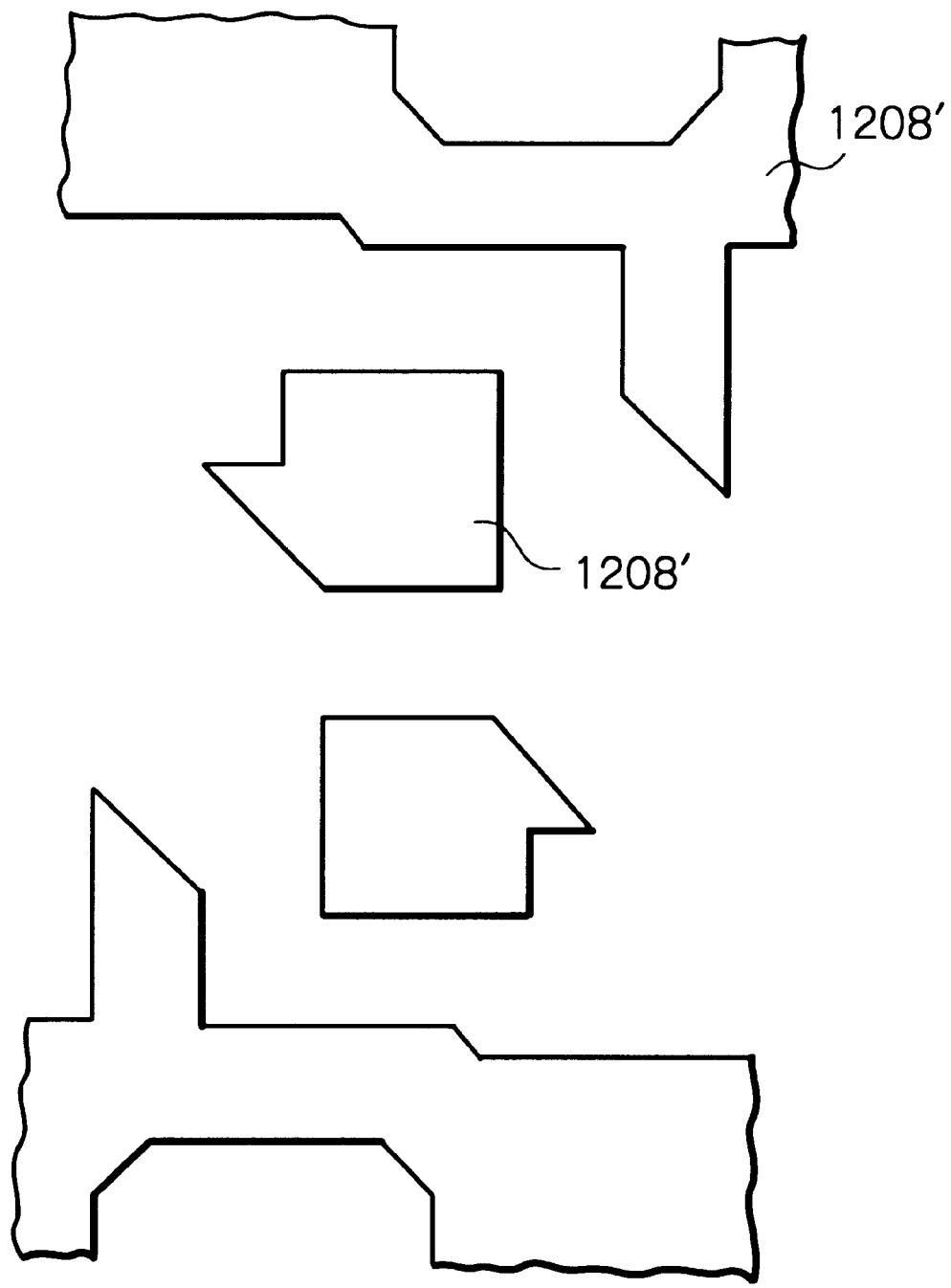
FIG. 21 is a plan view illustrating a modification of the photo resist pattern layer of FIGS. 12D and 16.

Also, in FIGS. 12D and 16, if the photoresist pattern layer 1208 is formed in a shape as indicated by 1208' in FIG. 21, the low resistance layer can be formed in advance.

Further, the doped polycrystalline silicon layer 1207 can be replaced by a metal layer made of aluminum or the like.

A second method for manufacturing the resistance type SRAM cell according to the present invention will be explained next with reference to FIGS. 22A through 22D and FIGS. 23 and 24. In the second method, FIGS. 12D, 12E, 12F and 12G are replaced by FIGS. 22A through 22D. That is, after the insulating layer 1206 is formed, a manufacturing step as illustrated in FIG. 22A is carried out.

Figure 22A:
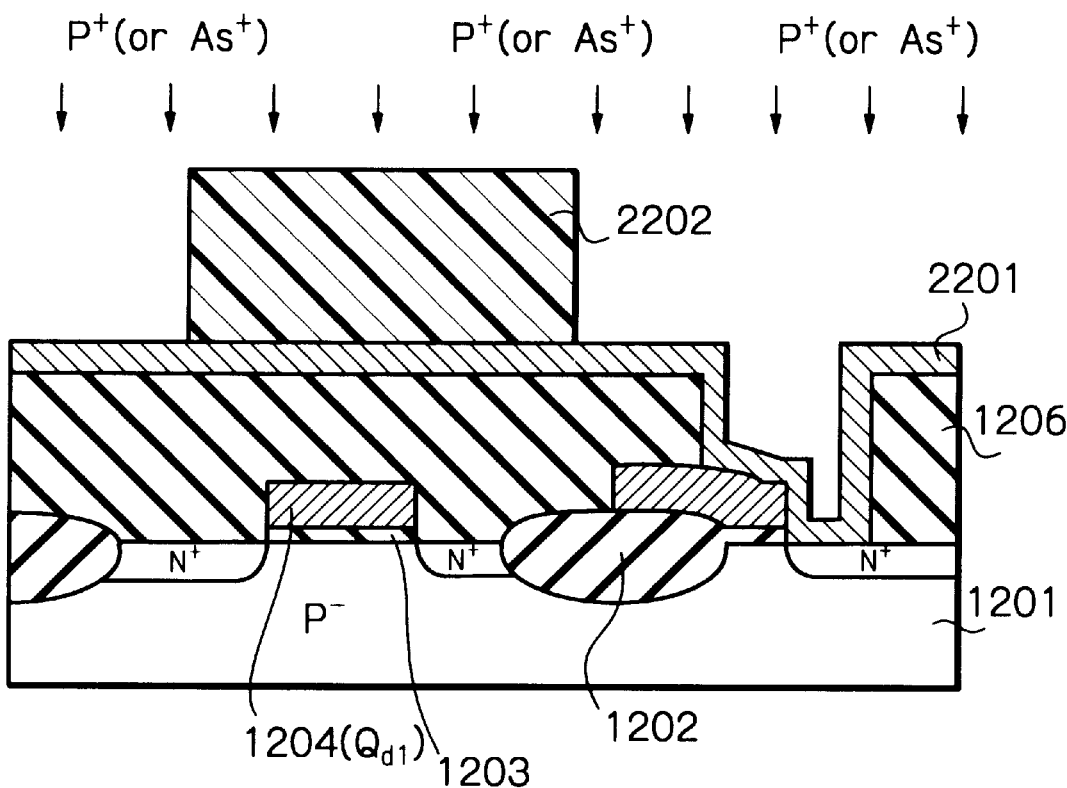
FIGS. 22A through 22D are cross-sectional views for explaining a second method for manufacturing the resistance type SRAM cell to which the resistance element of FIG. 7 is applied.
Figure 23:
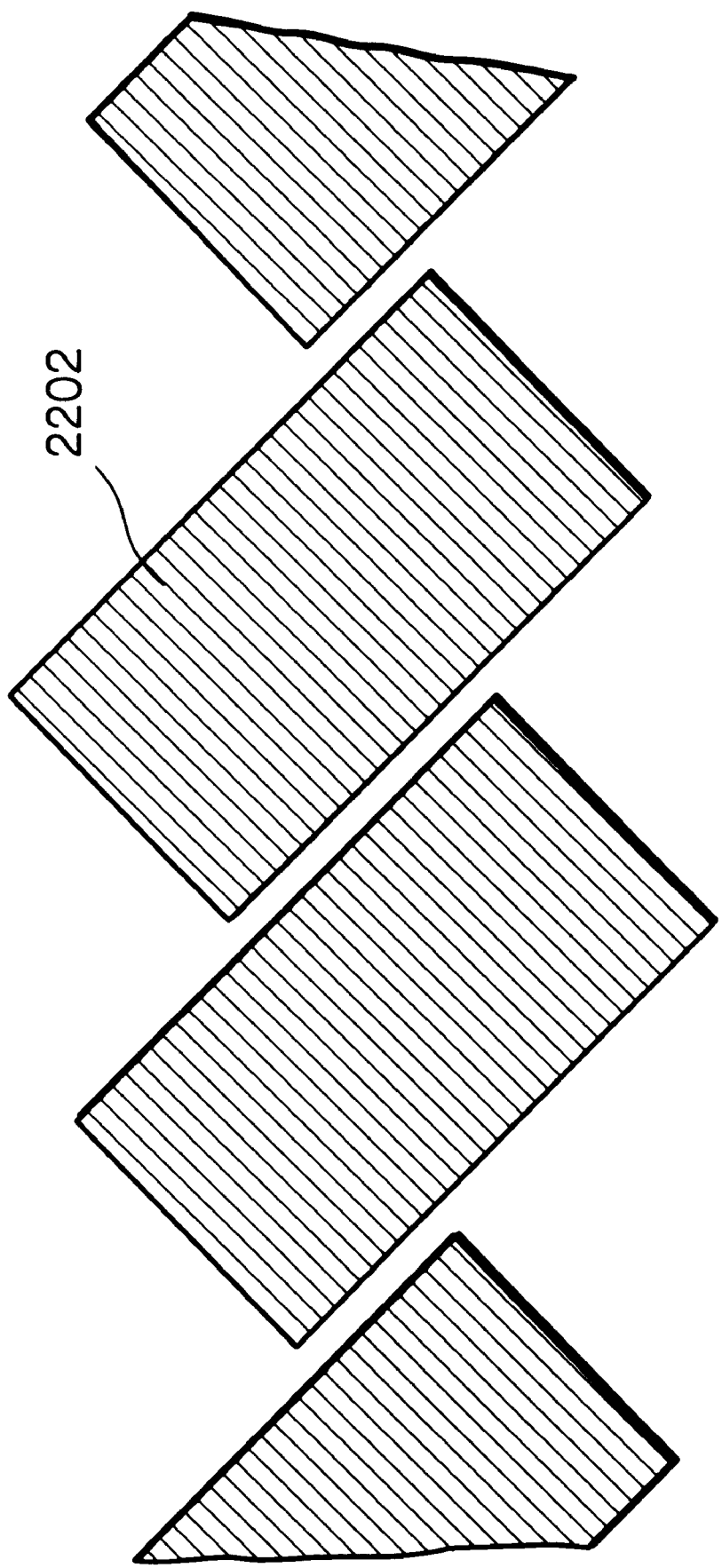
FIGS. 23 and 24 are plan views for supplementary explaining the first manufacturing method as illustrated in FIGS. 22A through 22D.

Referring to FIG. 22A, an about 30 to 150 nm thick high resistance layer 2201 made of non-doped polycrystalline silicon or SIPOS is deposited on the entire surface by using a CVD process. Then, a rectangular photoresist pattern layer 2202 as illustrating in FIG. 23 is formed on the high resistance layer 2201. Then, about $1 \times 10^{14}$ to $1 \times 10^{16}$ phosphorus- or arsenic-ions per cm$^2$ are implanted into the high resistance layer 2201 by using the photoresist pattern layer 2202 as a mask.

Figure 22B:
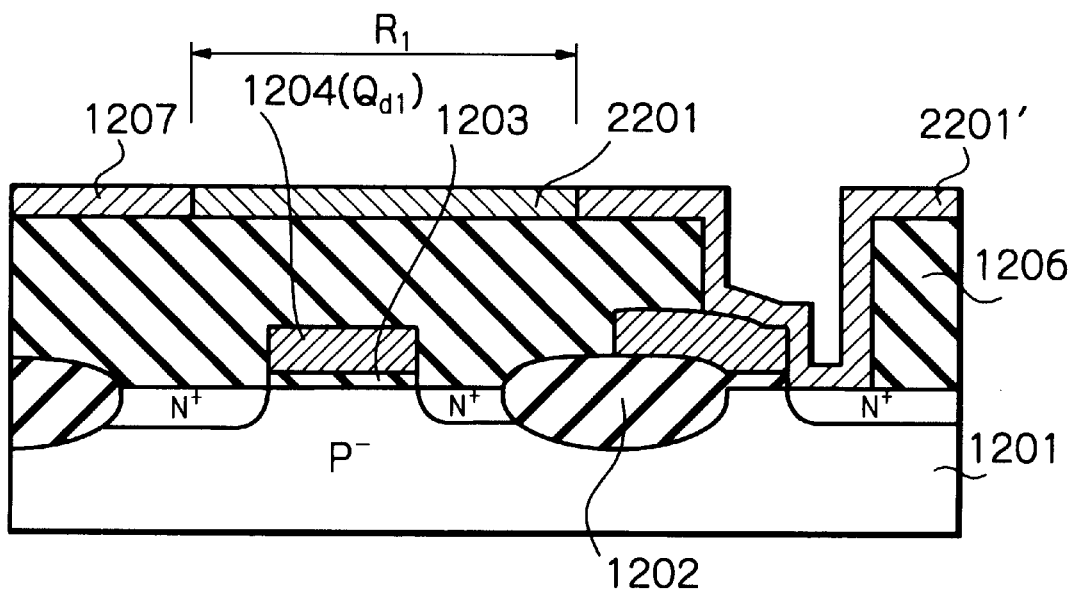

Next, referring to FIG. 22B, the photoresist pattern layer 2202 is removed. As a result, a part of the high resistance layer 2201 where the above-mentioned ions are doped is changed into a low resistance section 2201'. On the other hand, a part of the high-resistance layer 2201 where the above-mentioned ions are not doped remains in a high resistance state and corresponds to the load resistor R$_1$.

Figure 22C:
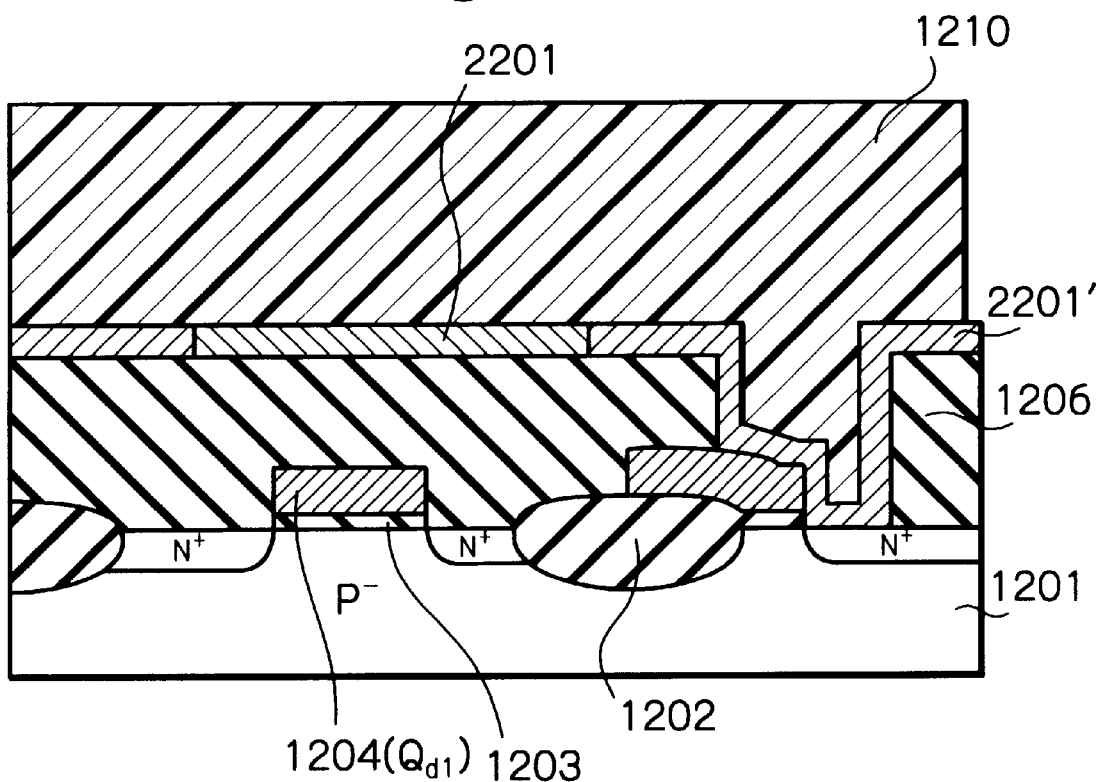

Next, referring to FIG. 22C, a photoresist pattern layer 1210 as illustrated in FIG. 17 is formed.

Figure 22D:
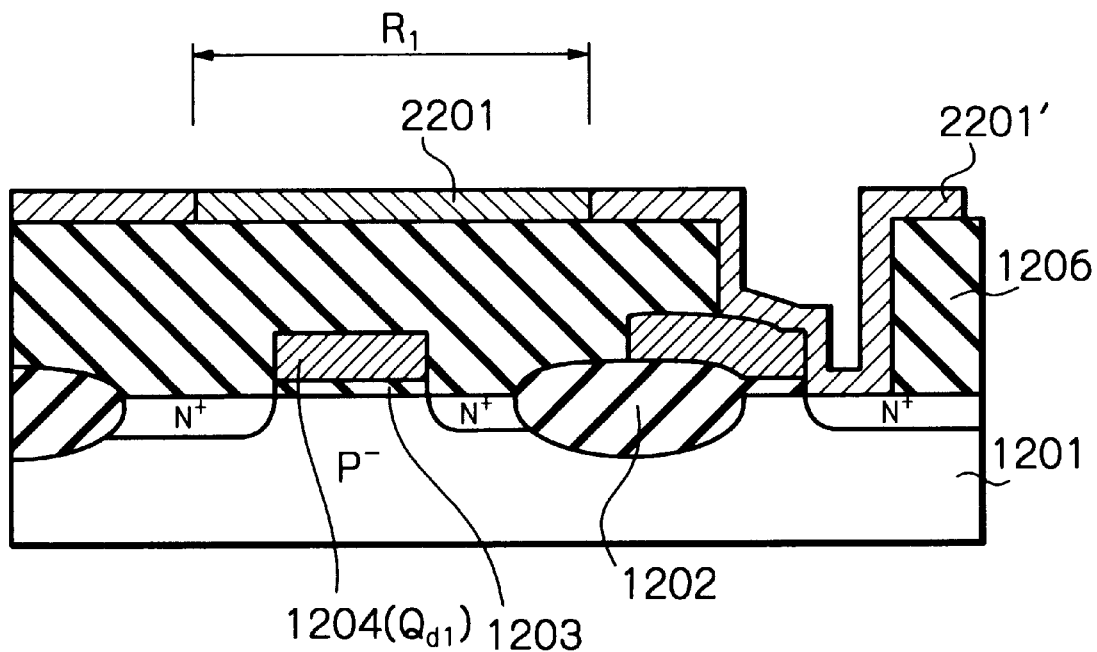
Figure 24:
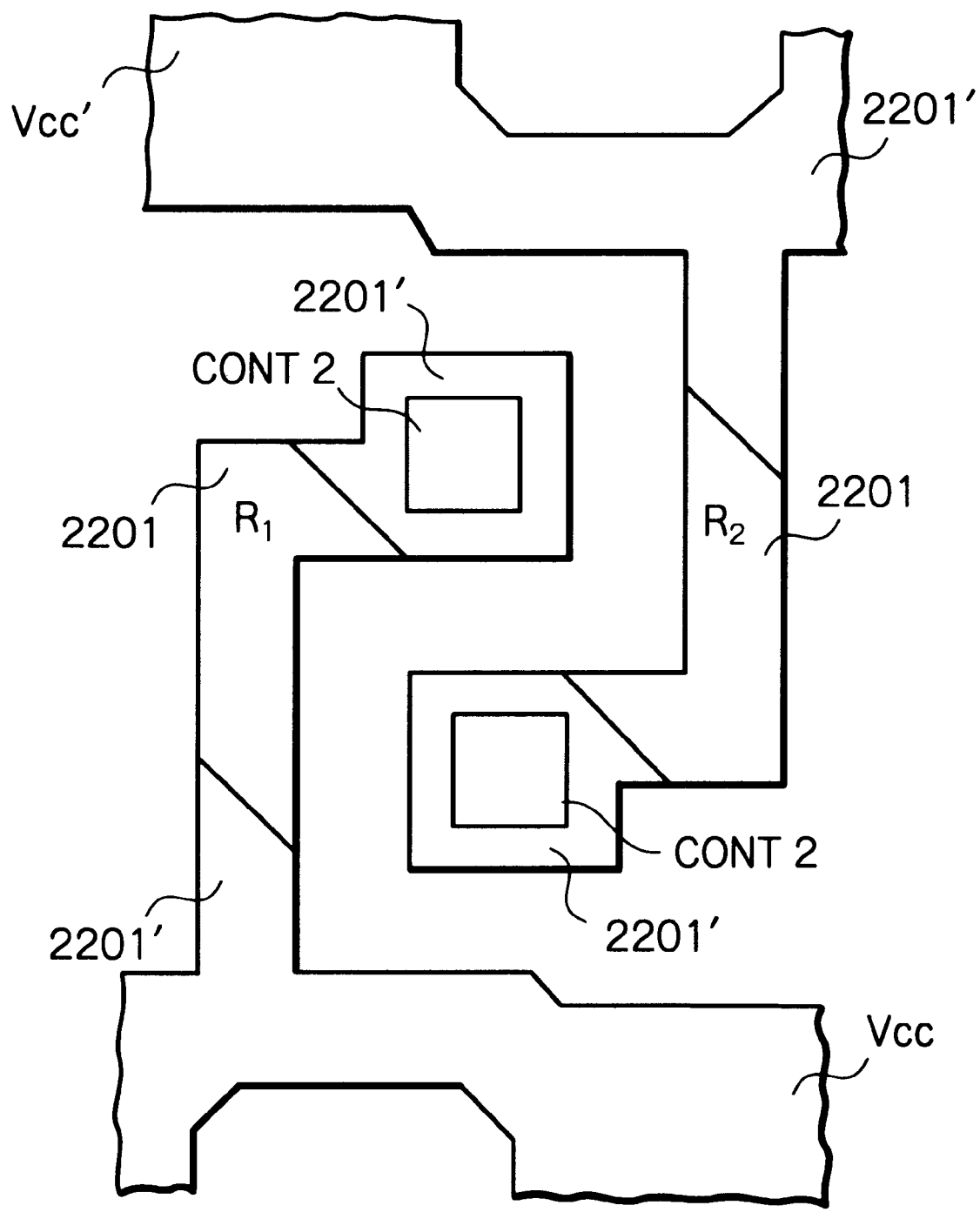

Next, referring to FIG. 22D, the low resistance layer 2201' is etched by using the photoresist pattern layer 1209 as a mask. Then, the photoresist pattern layer 1209 is removed. A plan view of FIG. 22D is illustrated in FIG. 24. That is, the load resistors R$_1$ and R$_2$ are made of the high resistance layer 2201, while the power supply lines V$_{CC}$ and V$_{CC}$' are made of the low resistance layer 2201'.

Figure 25A:
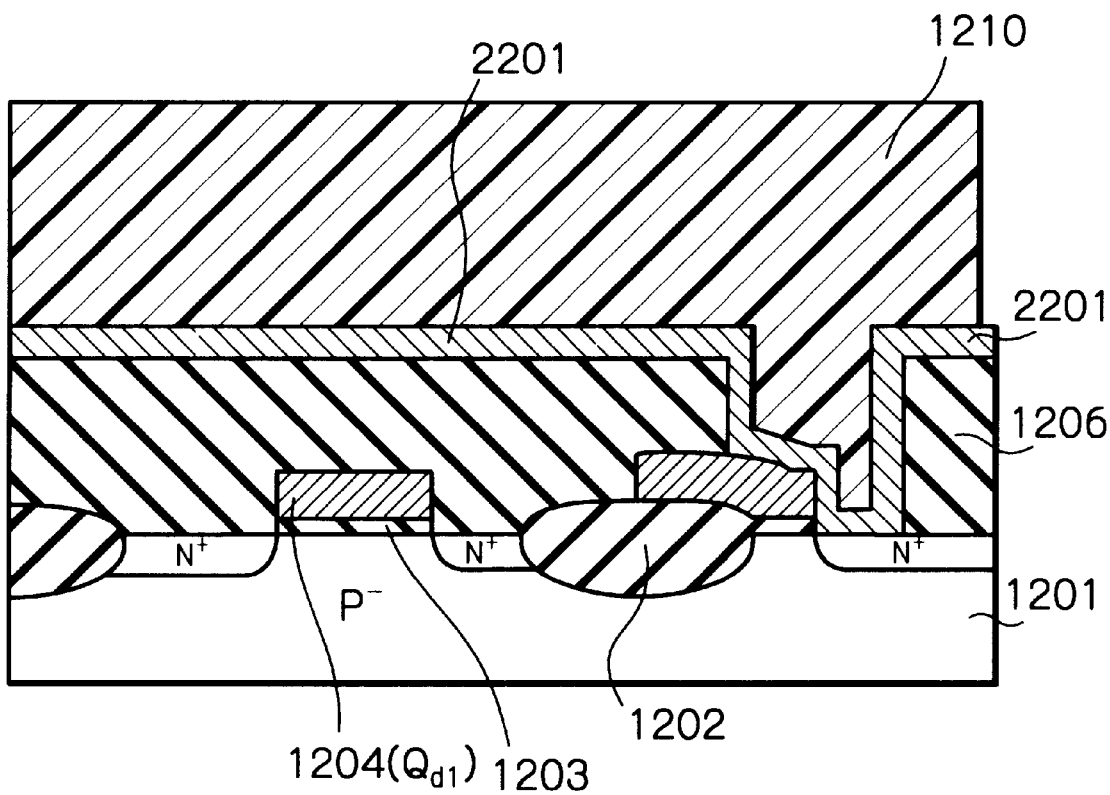
FIGS. 25A, 25B, 25C and 25D are cross-sectional views illustrating modifications of FIGS. 22A, 22B, 22C and 22D, respectively.
Figure 25B:
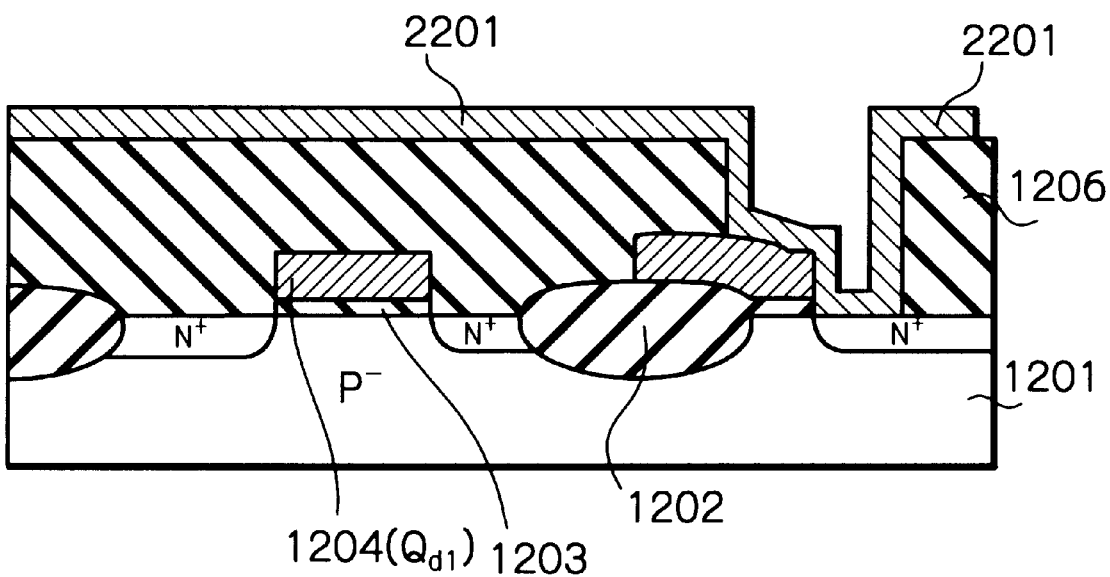
Figure 25C:
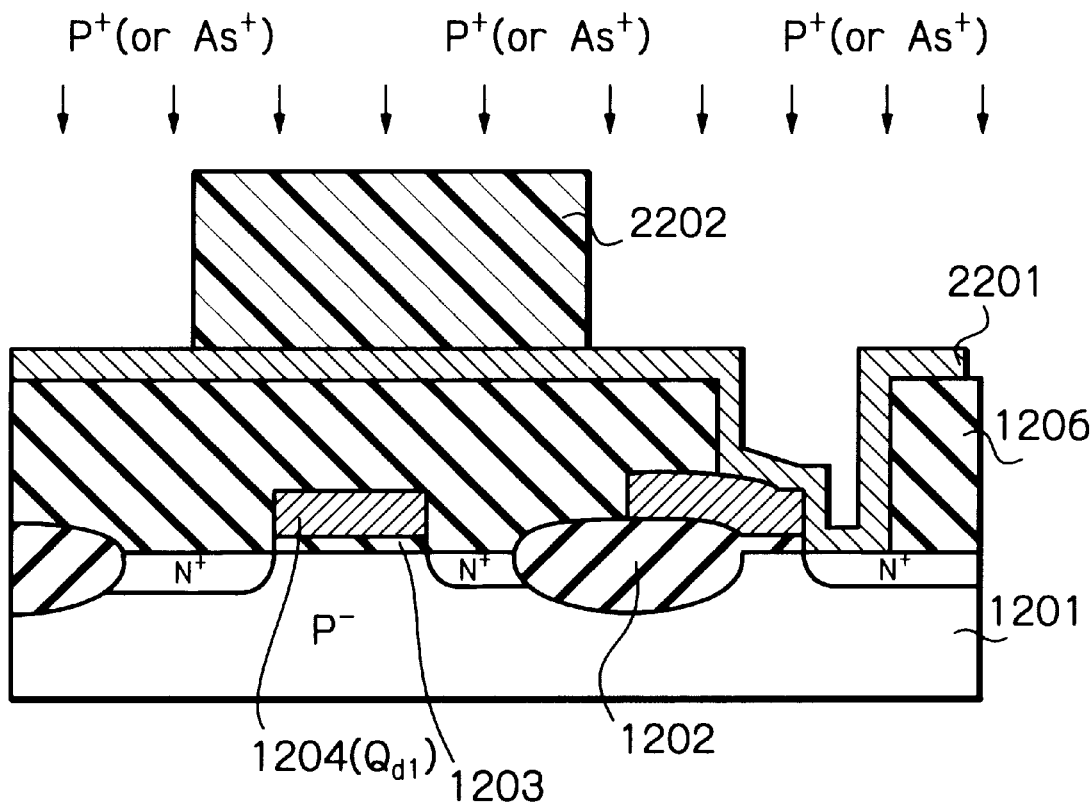
Figure 25D:
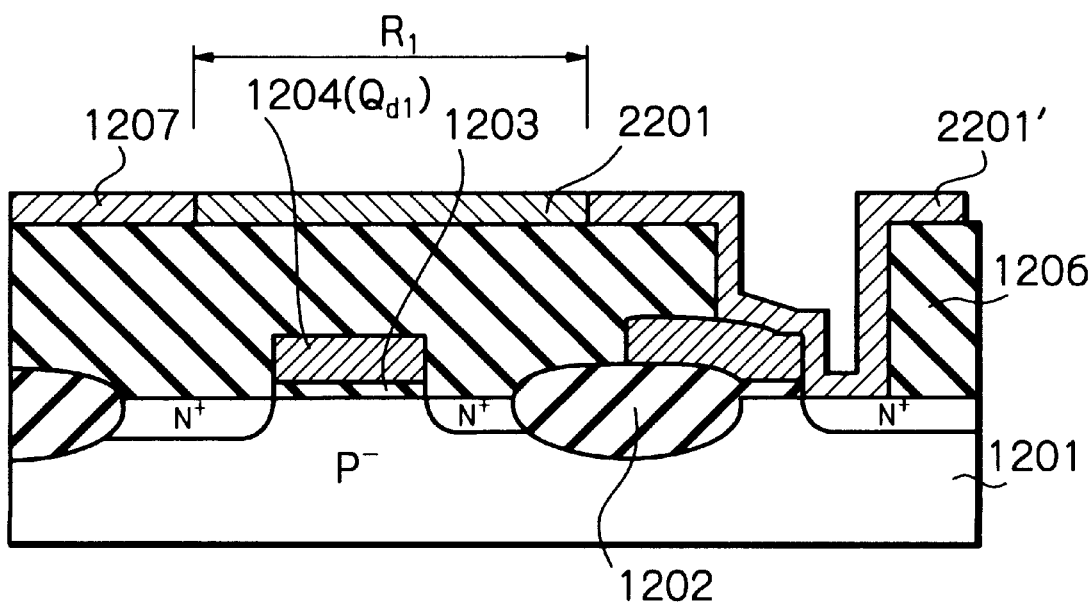

In FIGS. 25A, 25B, 25C and 25D, which illustrate modifications of FIGS. 22A, 22B, 22C and 22D, after the high resistance layer 2201 is patterned by steps as illustrated in FIGS. 25A and 25B, a part of the high resistance layer 2201 is changed by doping impurity ions into a low resistance layer 2201' as illustrated in FIGS. 25C and 25D.

Even in the second resistance type SRAM cell manufacturing method as illustrated in FIGS. 22A through 22D, FIGS. 23 and 24, and FIGS. 25A through 25D, the same effect can be expected as in the above-mentioned first resistance type SRAM cell manufacturing method.

Figure 26:
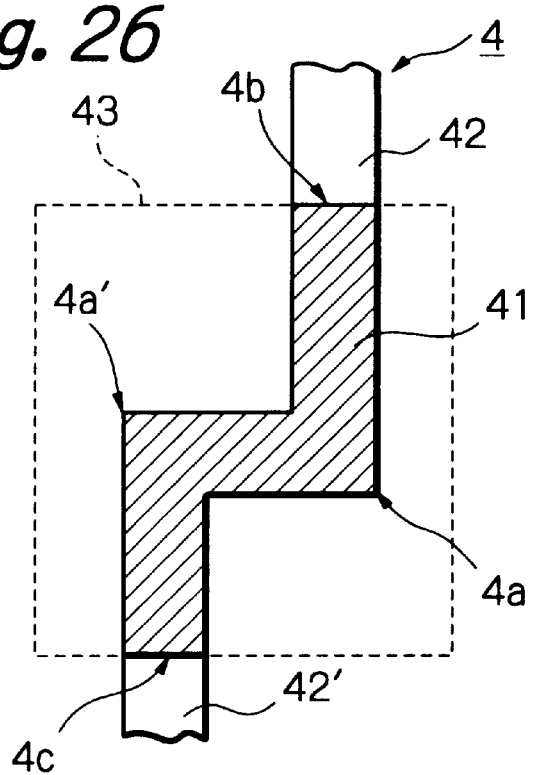
FIG. 26 is a plan view illustrating a fourth embodiment of the resistance element according to the present invention.

In FIG. 26, which illustrates a fourth embodiment of the present invention, a resistance element is formed by a connection layer 4 having a flexing portion including two flexing points 4a and 4a' and being divided into a high resistance section 41 and low resistance sections 42 and 42' in parallel with each other. In this case, the high resistance section 41 includes the flexing points 4a and 4a'. A boundary 4b between the high resistance section 41 and the low resistance section 42 is in parallel with a boundary 4C between the high resistance layer 41 and the low resistance layer 42'. Note that the boundaries 4b and 4c are not always perpendicular to the low resistance layers 42 and 42'.

Figure 27:
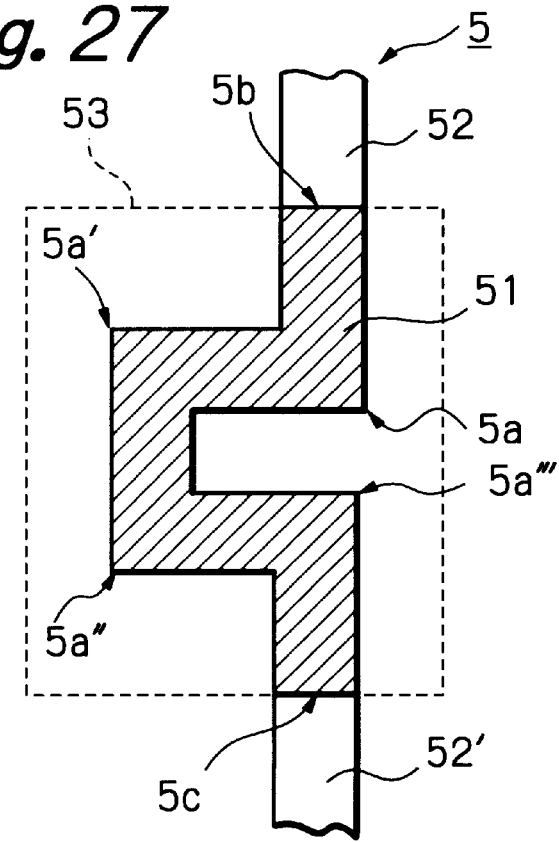
FIG. 27 is a plan view illustrating a fifth embodiment of the resistance element according to the present invention.

In FIG. 27, which illustrates a fifth embodiments of the present invention, a resistance element is formed by a connection layer 5 having a flexing portion including four flexing points 5a, 5a'5a" and 5a'" and being divided into a high resistance section 51 and low resistance sections 52 and 52' in parallel with each other. In this case, the high resistance section 51 includes the flexing points 5a, 5a' 5a" and 5a'". A boundary 5b between the high resistance section 51 and the low resistance section 52 is in parallel with a boundary 5C between the high resistance layer 51 and the low resistance layer 52'. Note that the boundaries 5b and 5c are not always perpendicular to the low resistance layers 52 and 52'.

Even in FIGS. 26 and 27, the resistance value R of the high resistance layer 41 (51) is hardly changed, even if a location of a photoresist pattern layer 43 (53) for defining the high resistance layer 41 (51) is shifted.

As explained hereinabove, according to the present invention, the fluctuation of the resistance value of a resistance element having a flexing point can be suppressed. In addition, in a resistance type SRAM cell having load resistors having flexing points, the resistance values of the load resistors can be prevented from being unbalanced, so that the data retention characteristics, the stand by characteristics and the soft error rate by α rays can be improved.

What is claimed is:

1. A static random access memory device comprising:

a resistance type flip-flop having two load resistors, each of said load resistors comprising a connection layer including a bending region, said connection layer comprising a high resistance section including said bending region and a high resistance section edge contacting a corresponding edge of a low resistance section, a boundary formed by the high resistance section edge and the corresponding edge of the low resistance section being approximately parallel with a bisector line passing through a bending point of said bending region and bisecting an angle defined by edges of said bending region into two equal angles.

2. The device as set forth in claim 1, wherein a difference in angle between said boundary and said bisector line is less than 10°.

3. The device as set forth in claim 1, wherein said high resistance section is made of one of non-doped polycrystalline silicon and semi-insulating polycrystalline silicon, said low resistance section being made of impurity-doped polycrystalline silicon.

4. A resistance element formed at a bending point of a connection layer having adjacent first and second low resistance sections, said resistance element comprising:

a high resistance section which includes a bending region defined by the bending point of the connection layer;

a first boundary formed by a first edge contacting an edge of the first low resistance section of the connection layer; and a second boundary formed by a second edge contacting an edge of the second low resistance section of the connection layer, wherein said first boundary and said second boundary are substantially parallel with one another and with a bisector line passing through the bending point and bisecting an angle defined by edges of said bending region into two equal angles.

5. The resistance element of claim 4, wherein each said first boundary and said second boundary are parallel with the bisector line within 10°.

6. A resistance element formed at a bending portion of a connection layer and sandwiched between first and second low resistance sections, said resistance element comprising:

a high resistance section including said bending portion;

a first boundary formed by a first edge of said high resistance section contacting an edge of the first low resistance section of the connection layer; and a second boundary formed by a second edge of said high resistance section contacting an edge of the second low resistance section of the connection layer, wherein said first boundary and said second boundary are substantially parallel with one another.

7. The resistance element as set forth in claim 4, wherein said high resistance section is made of one of non-doped polycrystalline silicon and semi-insulating polycrystalline silicon, said low resistance section being made of impurity-doped polycrystalline silicon.

8. The resistance element as set forth in claim 6, wherein said high resistance section is made of one of non-doped polycrystalline silicon and semi-insulating polycrystalline silicon, said low resistance section being made of impurity-doped polycrystalline silicon.

* * * * *